US012735438B2

(12) United States Patent
Koch

(10) Patent No.: US 12,735,438 B2
(45) Date of Patent: Sep. 15, 2026

(54) ORGANIC MOLECULES FOR OPTOELECTRONIC DEVICES

(71) Applicant: Samsung Display Co., Ltd., Yongin-si (KR)

(72) Inventor: Federico Koch, Schonungen (DE)

(73) Assignee: Samsung Display Co., Ltd., Yongin-si (KR)

( * ) Notice: Subject to any disclaimer, the term of this patent is extended or adjusted under 35 U.S.C. 154(b) by 882 days.

(21) Appl. No.: 18/022,129

(22) PCT Filed: Aug. 20, 2021

(86) PCT No.: PCT/EP2021/073122
§ 371 (c)(1),
(2) Date: Feb. 17, 2023

(87) PCT Pub. No.: WO2022/038256
PCT Pub. Date: Feb. 24, 2022

(65) Prior Publication Data

US 2023/0303595 A1 Sep. 28, 2023

(30) Foreign Application Priority Data

Aug. 21, 2020 (EP) .................................... 20192186

(51) Int. Cl.
*C07F 5/02* (2006.01)
*C07F 7/08* (2006.01)
(Continued)

(52) U.S. Cl.
CPC ............ *C07F 5/027* (2013.01); *C07F 7/0805* (2013.01); *C07F 13/00* (2013.01); *C09K 11/02* (2013.01);
(Continued)

(58) Field of Classification Search
CPC ....... C07F 5/027; C09K 11/06; H10K 85/622; H10K 85/658
See application file for complete search history.

(56) References Cited

U.S. PATENT DOCUMENTS

2023/0329110 A1 10/2023 Danz

FOREIGN PATENT DOCUMENTS

CN 104725378 A 6/2015
CN 106654053 A 5/2017
(Continued)

OTHER PUBLICATIONS

International Search Report for corresponding Application No. PCT/EP2021/073122 dated Dec. 23, 2021, 2pp.

*Primary Examiner* — Vu A Nguyen
(74) *Attorney, Agent, or Firm* — Womble Bond Dickinson (US) LLP

(57) ABSTRACT

The invention relates to an organic molecule for optoelectronic devices. According to the invention, the organic molecule has: —a first chemical moiety with a structure of formula (I), —two second chemical moieties with a structure of formula (II), wherein X and Y are at each occurrence independently from another selected from the group consisting of B and N; Z is a direct bond; $R^I$, $R^{II}$, $R^{III}$, $R^{IV}$, $R^V$, $R^{VI}$, $R^{VII}$, $R^{VIII}$, $R^{IX}$, and $R^X$ are at each occurrence independently from another selected from the group consisting of the binding site of a single bond linking the first chemical moiety to the second moiety, and R*; R* is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, $C_1$-$C_5$-alkoxy, $C_1$-$C_5$-thioalkoxy, $C_2$-$C_5$-alkenyl, $C_2$-$C_5$-alkynyl, $C_6$-$C_{18}$-aryl, $C_3$-$C_{17}$-heteroaryl, $N(C_6\text{-}C_{18}\text{-aryl})_2$, $N(C_3\text{-}C_{17}\text{-heteroaryl})_2$; $N(C_3\text{-}C_{17}\text{-heteroaryl})(C_6\text{-}C_{18}\text{-aryl})$; and the dashed lines represent the binding sites of the first chemical moiety to the second chemical moiety.

(I)

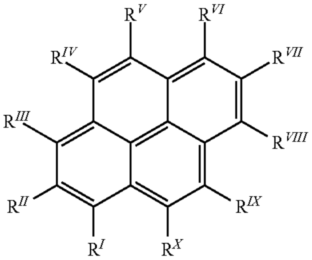

(II)

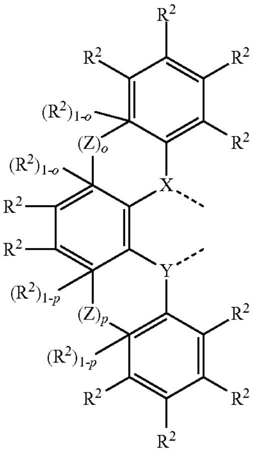

18 Claims, No Drawings

(51) Int. Cl.

| | |
|---|---|
| ***C07F 13/00*** | (2006.01) |
| ***C09K 11/02*** | (2006.01) |
| ***C09K 11/06*** | (2006.01) |
| ***H10K 50/11*** | (2023.01) |
| ***H10K 71/10*** | (2023.01) |
| ***H10K 85/40*** | (2023.01) |
| ***H10K 85/60*** | (2023.01) |

(52) U.S. Cl.
CPC .............. *C09K 11/06* (2013.01); *H10K 85/40* (2023.02); *H10K 85/615* (2023.02); *H10K 85/622* (2023.02); *H10K 85/633* (2023.02); *H10K 85/658* (2023.02); *C07B 2200/05* (2013.01); *C09K 2211/1018* (2013.01); *H10K 50/11* (2023.02); *H10K 71/10* (2023.02)

(56) References Cited

FOREIGN PATENT DOCUMENTS

| | | | | | |
|---|---|---|---|---|---|
| CN | 108342192 | A | * | 7/2018 | .............. C07F 5/027 |
| JP | 2014-205641 | A | | 10/2014 | |
| JP | 2023-539562 | A | | 9/2023 | |
| WO | WO 2020-085829 | A | | 4/2020 | |

* cited by examiner

ORGANIC MOLECULES FOR OPTOELECTRONIC DEVICES

CROSS-REFERENCE TO RELATED APPLICATIONS

This application is a U.S. National Phase patent application of International Patent Application Number PCT/EP2021/073122, filed on Aug. 20, 2021, which claims priority to European Patent Application Number 20192186.3, filed on Aug. 21, 2020, the entire content of all of which is incorporated herein by reference.

The invention relates to organic light-emitting molecules and their use in organic light-emitting diodes (OLEDs) and in other optoelectronic devices.

DESCRIPTION

The object of the present invention is to provide molecules which are suitable for use in optoelectronic devices.

This object is achieved by the invention which provides a new class of organic molecules.

According to the invention, the organic molecules are purely organic molecules, i.e. they do not contain any metal ions in contrast to metal complexes known for the use in optoelectronic devices. The organic molecules of the invention, however, include metalloids, in particular B, Si, Sn, Se, and/or Ge.

According to the present invention, the organic molecules exhibit emission maxima in the blue, sky-blue, green or yellow spectral range. The organic molecules exhibit in particular emission maxima between 420 nm and 520 nm, preferably between 440 nm and 495 nm, more preferably between 450 nm and 470 nm or the organic molecules exhibit in particular emission maxima between 490 and 600 nm, more preferably between 510 and 560 nm, and even more preferably between 520 and 540 nm. The photoluminescence quantum yields of the organic molecules according to the invention are, in particular, 50% or more. The use of the molecules according to the invention in an optoelectronic device, for example an organic light-emitting diode (OLED), leads to higher efficiencies or higher color purity, expressed by the full width at half maximum (FWHM) of emission, of the device. Corresponding OLEDs have a higher stability than OLEDs with known emitter materials and comparable color.

The organic light-emitting molecules according to the invention comprise or consist of:

one first chemical moiety comprising or consisting of a structure of Formula I:

Formula I

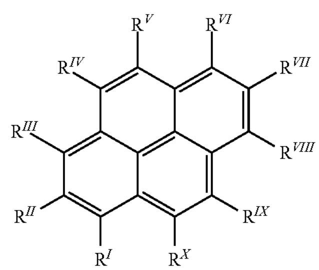

two second chemical moieties comprising or consisting of a structure of Formula II:

Formula II

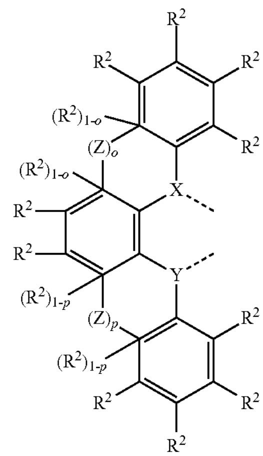

wherein

X and Y are at each occurrence independently from another selected from the group consisting of B and N;

$R^I$, $R^{II}$, $R^{III}$, $R^{IV}$, $R^V$, $R^{VI}$, $R^{VII}$, $R^{VIII}$, $R^{IX}$, and $R^X$ are at each occurrence independently from another selected from the group consisting of the binding site of a single bond linking the first chemical moiety to the second moiety, and R*;

R* is at each occurrence independently from another selected from the group consisting of hydrogen, deuterium, OPh (Ph=phenyl), SPh, $CF_3$, CN, F, $Si(C_1-C_5-alkyl)_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6-C_{18}-aryl)_2$, $N(C_3-C_{17}-heteroaryl)_2$;

$N(C_3-C_{17}-heteroaryl)(C_6-C_{18}-aryl)$;

The dashed lines “ ” in Formula II represent the binding sites of the first chemical moiety to the second chemical moiety;

Z is a direct bond;

is at each occurrence independently an integer 0 or 1;

p is at each occurrence independently an integer 0 or 1;

$R^2$ is at each occurrence independently from another selected from the group consisting of hydrogen, deuterium, $N(R^5)_2$, $OR^5$, $Si(R^5)_3$, $B(OR^5)_2$, $OSO_2R^5$, $CF_3$,

CN,

F,

Br,

I, $C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently from another selected from the group consisting of hydrogen, deuterium, $N(R^6)_2$, $OR^6$, $Si(R^6)_3$, $B(OR^6)_2$, $OSO_2R^6$, $CF_3$,

CN,

F,

Br,

I, $C_1$-$C_{40}$-alkyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, C≡C, $Si(R^6)_2$, $Ge(R^6)_2$, $Sn(R^6)_2$, C═O, C═S, C═Se, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$;

$R^6$ is at each occurrence independently from another selected from the group consisting of hydrogen, deuterium, OPh, SPh, $CF_3$, CN, F, $Si(C_1$-$C_5$-alkyl$)_3$, $Si(Ph)_3$, $C_1$-$C_5$-alkyl, wherein optionally one or more hydrogen atoms are independently from each other substituted by deuterium, CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$;

wherein adjacent groups $R^2$ optionally are bonded to each other to form an aryl or heteroaryl ring, which is optionally substituted with one or more $C_1$-$C_5$-alkyl substituents, deuterium, halogen, CN or $CF_3$; and exactly two selected from a group consisting of X and Y are B and exactly two selected from a group consisting of X and Y are N;

two adjacent substituents selected from the group consisting of:

$R^I$ and $R^{II}$, $R^{II}$ and $R^{III}$ and $R^{IV}$ and $R^V$ represent the binding sites of single bonds linking the first chemical moiety to the second chemical moiety to form a ring and two adjacent substituents selected from the group consisting of:

$R^{VI}$ and $R^{VII}$, $R^{VII}$ and $R^{VIII}$ and $R^{IX}$ and $R^X$ represent the binding sites of single bonds linking the first chemical moiety to the other (i.e. the second) second chemical moiety to form a ring.

The organic molecule does not have more than two second chemical moieties.

Specific examples of organic molecules are listed below:

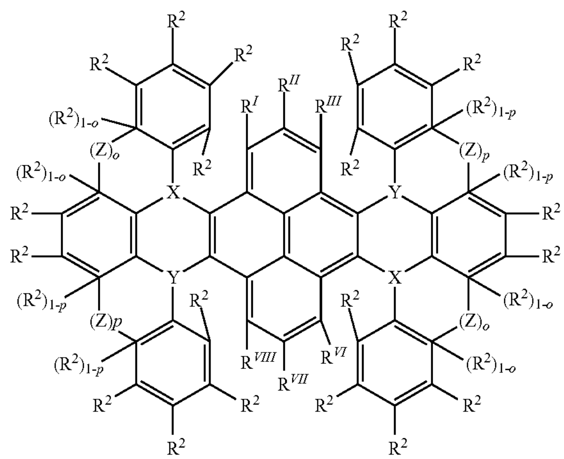

-continued

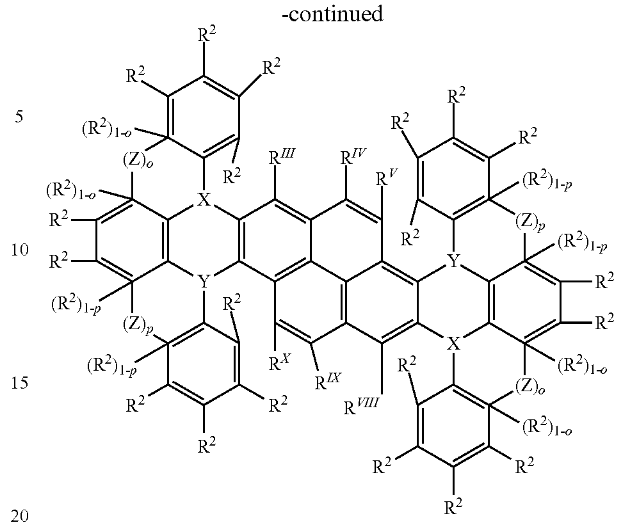

In a preferred embodiment, X is B and Y is N. In other embodiments, one X is B and one X is N.

In a preferred embodiment o is 0 or 1; and p is 0 or 1.

In a preferred embodiment, o is 1.

In a preferred embodiment, p is 0 and o is 1.

In a more preferred embodiment, X is B, Y is N, p is 0 and o is 1.

In one embodiment, o and p are both 0.

In one embodiment of the invention, $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, wherein $R^2$ is independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment, $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$.

In one embodiment, R* is at each occurrence independently from another selected from the group consisting of:

hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment, $R^2$ is at each occurrence independently from another selected from the group consisting of:

hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, $R^2$ is at each occurrence independently from another selected from the group consisting of:

hydrogen, deuterium, $^{i}$Pr, and

Ph, which is optionally substituted with one or more Ph substituents.

In a certain embodiment $R^2$ is at each occurrence hydrogen.

In one embodiment, R* is at each occurrence independently from another selected from the group consisting of:

hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, R* is at each occurrence independently from another selected from the group consisting of:

hydrogen, deuterium, $^{i}$Pr, and

Ph, which is optionally substituted with one or more Ph substituents.

In certain embodiments, R* is at each occurrence hydrogen.

In one embodiment, the organic molecule comprises or consists of a structure of Formula Ia and Ib:

Formula Ia

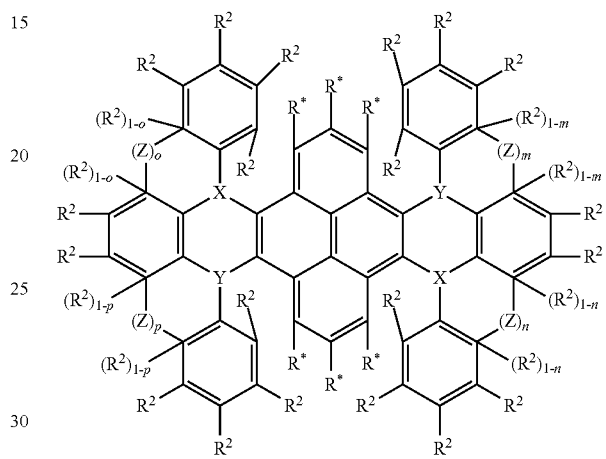

Formula Ib

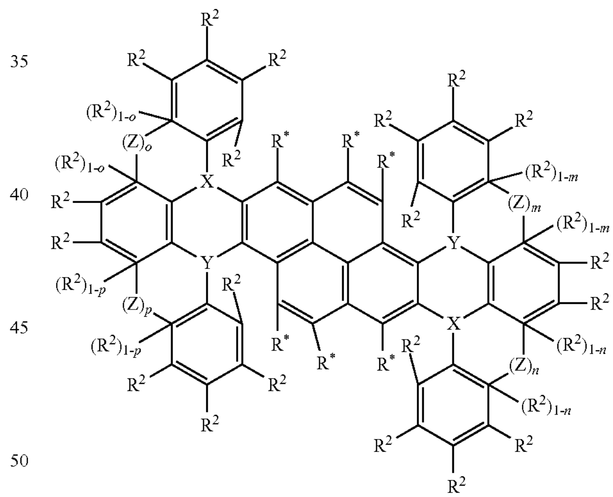

wherein m is 0 or 1;

n is 0 or 1:

and exactly two selected from a group consisting of X and Y are B and exactly two selected from a group consisting of X and Y are N;

In one embodiment, the organic molecule comprises or consists of a structure of Formula Ia and Ib, wherein o is 1.

In one embodiment, the organic molecule comprises or consists of a structure of Formula Ia and Ib, wherein o is 1 and p is 0.

In one embodiment, the organic molecule comprises or consists of a structure of Formula Ia and Ib, wherein o is 1 and p is 0 and exactly one selected from m and n is 1 and exactly one selected from n and m is 0.

In one embodiment, the organic molecule comprises or consists of a structure of Formula Ia and Ib, wherein R* is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment of the invention, the organic molecule comprises or consists of a structure of Formula Ia and Ib, wherein $R^2$ is independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule comprises or consists of a structure of Formula Ia and Ib, wherein $R^2$ is independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment, the organic molecule comprises or consists of a structure of Formula Ia and Ib, wherein $R^2$ is at each occurrence independently from another selected from the group consisting of hydrogen, deuterium, OPh, SPh, $CF_3$, CN, F, $Si(C_1$-$C_5$-alkyl$)_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl$)$.

In one embodiment, the organic molecule comprises or consists of a structure of Formula Ia and Ib, wherein $R^2$ is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, $R^2$ is at each occurrence independently from another selected from the group consisting of:

hydrogen, deuterium, $^{i}$Pr, and

Ph, which is optionally substituted with one or more Ph substituents;

In a certain embodiment the organic molecule comprises or consists of a structure of Formula Ia and Ib, wherein $R^2$ is at each occurrence hydrogen;

In one embodiment, the organic molecule comprises or consists of a structure of Formula Ia and Ib, wherein R* is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph;

In a preferred embodiment, the organic molecule comprises or consists of a structure of Formula Ia and Ib, wherein R* is at each occurrence independently from another selected from the group consisting of:

hydrogen, deuterium, $^{i}$Pr, and

Ph, which is optionally substituted with one or more Ph substituents;

In a certain embodiment the organic molecule comprises or consists of a structure of Formula Ia and Ib, wherein R* is at each occurrence hydrogen;

In one embodiment, the organic molecule comprises or consists of a structure of Formula Ia and Ib, wherein $R^2$, and R* are at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, the organic molecule comprises or consists of a structure of Formula Ia and Ib, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ia and Ib, wherein $R^2$, and R* are at each occurrence hydrogen.

In one embodiment, the organic molecule comprises or consists of a structure of Formula Ia and Ib, wherein o, p, n and m are 0.

In one embodiment, the organic molecule comprises or consists of a structure of Formula Ia:

Formula Ia

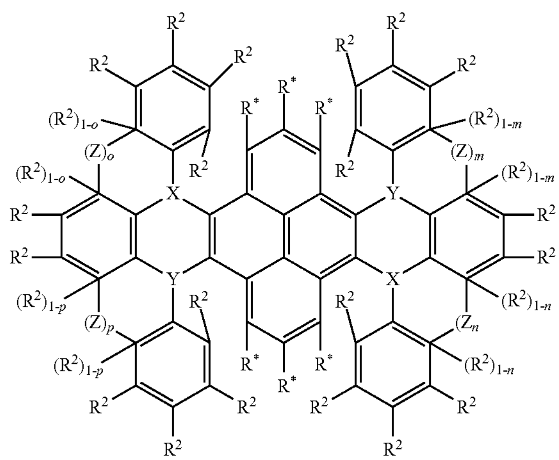

wherein exactly two selected from a group consisting of X and Y are B and exactly two selected from a group consisting of X and Y are N;

In one embodiment, the organic molecule comprises or consists of a structure of Formula Ia, wherein o is 1.

In one embodiment, the organic molecule comprises or consists of a structure of Formula Ia, wherein o is 1 and p is 0 and exactly one selected from m and n is 1 and exactly one selected from n and m is 0.

In one embodiment, the organic molecule comprises or consists of a structure of Formula Ia, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula Ia, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule comprises or consists of a structure of Formula Ia, wherein $R^2$ is independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment, the organic molecule comprises or consists of a structure of Formula Ia, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3-C_{17}$-heteroaryl$)_2$; and $N(C_3-C_{17}$-heteroaryl$)(C_6-C_{18}$-aryl);

In one embodiment, the organic molecule comprises or consists of a structure of Formula Ia, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ia, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ia, wherein $R^2$ is at each occurrence hydrogen.

In one embodiment, the organic molecule comprises or consists of a structure of Formula Ia, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ia, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ia, wherein R* is at each occurrence hydrogen.

In one embodiment, the organic molecule comprises or consists of a structure of Formula Ia, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ia, wherein $R^2$, and R* are at each occurrence independently from another selected from the group consisting of:

hydrogen, deuterium, $^i$Pr, and

Ph, which is optionally substituted with one or more Ph substituents.

In a certain embodiment, the organic molecule comprises or consists of a structure of Formula Ia, wherein $R^2$, and R* are at each occurrence hydrogen.

In one embodiment, the organic molecule comprises or consists of a structure of Formula Ia, wherein o, p, n and m are 0.

In one embodiment, the organic molecule comprises or consists of a structure of Formula Ib:

Formula Ib

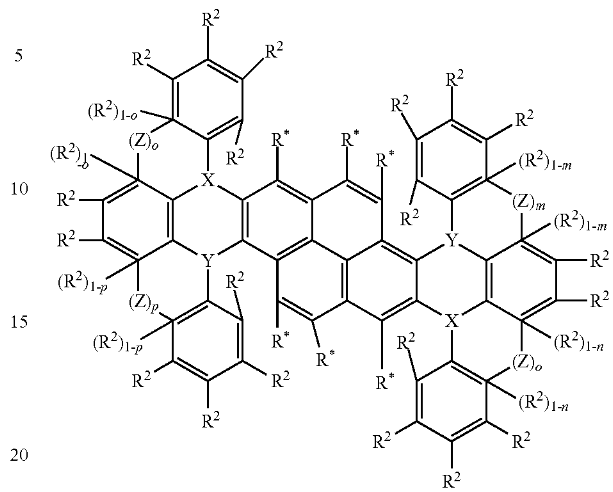

wherein exactly two selected from a group consisting of X and Y are B and exactly two selected from a group consisting of X and Y are N.

In one embodiment, the organic molecule comprises or consists of a structure of Formula Ib, wherein o is 1.

In one embodiment, the organic molecule comprises or consists of a structure of Formula Ib, wherein o is 1 and p is 0 and exactly one selected from m and n is 1 and exactly one selected from n and m is 0.

In one embodiment, the organic molecule comprises or consists of a structure of Formula Ib, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula Ib, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule comprises or consists of a structure of Formula Ib, wherein $R^2$ is independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph, In one embodiment, the organic molecule comprises or consists of a structure of Formula Ib, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$.

In one embodiment, the organic molecule comprises or consists of a structure of Formula Ib, wherein $R^2$ is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, the organic molecule comprises or consists of a structure of Formula Ib, wherein $R^2$ is at each occurrence independently from another selected from the group consisting of:

hydrogen, deuterium, $^{i}$Pr, and

Ph, which is optionally substituted with one or more Ph substituents.

In a certain embodiment the organic molecule comprises or consists of a structure of Formula Ib, wherein $R^2$ is at each occurrence hydrogen.

In one embodiment, the organic molecule comprises or consists of a structure of Formula Ib, wherein R* is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, the organic molecule comprises or consists of a structure of Formula Ib, wherein R* is at each occurrence independently from another selected from the group consisting of:

hydrogen, deuterium, $^{i}$Pr, and

Ph, which is optionally substituted with one or more Ph substituents.

In a certain embodiment the organic molecule comprises or consists of a structure of Formula Ib, wherein R* is at each occurrence hydrogen.

In one embodiment, the organic molecule comprises or consists of a structure of Formula Ib, wherein $R^2$, and R* are at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, the organic molecule comprises or consists of a structure of Formula Ib wherein, wherein $R^2$, and R* are at each occurrence independently from another selected from the group consisting of:

hydrogen, deuterium, $^{i}$Pr, and

Ph, which is optionally substituted with one or more Ph substituents.

In a certain embodiment the organic molecule comprises or consists of a structure of Formula Ib, wherein $R^2$, and R* are at each occurrence hydrogen.

In one embodiment, the organic molecule comprises or consists of a structure of Formula Ib, wherein o, p, n and m are 0.

In one embodiment, the organic molecule comprises or consists of a structure of Formula I, wherein the exactly two second chemical moieties comprise a structure selected from the group consisting of Formulas IIa and IIb:

Formula IIa

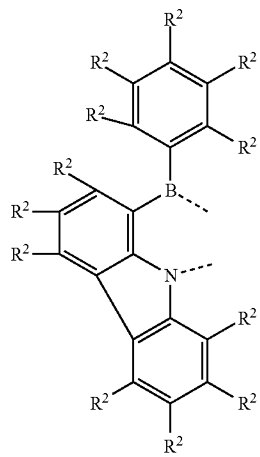

Formula IIb

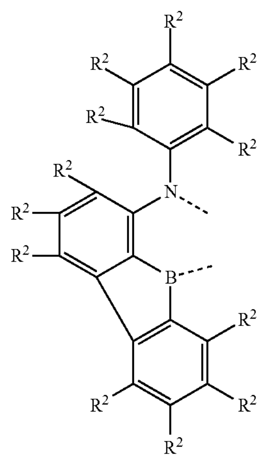

In one embodiment, the organic molecule comprises or consists of a structure of Formula I, wherein the exactly two second chemical moieties comprise a structure selected from the group consisting of Formulas IIa and IIb, wherein R* is at each occurrence independently from another selected from the group consisting of:

hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment, the organic molecule comprises or consists of a structure of Formula I, wherein the exactly two second chemical moieties comprise a structure selected from the group consisting of Formulas IIa and IIb, wherein $R^2$ is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment of the invention, the organic molecule comprises or consists of a structure of Formula I, wherein the exactly two second chemical moieties comprise a structure selected from the group consisting of Formulas IIa and IIb, wherein $R^2$ is independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In one embodiment of the invention, the organic molecule comprises or consists of a structure of Formula I, wherein the exactly two second chemical moieties comprise a structure selected from the group consisting of Formulas IIa and IIb, wherein $R^2$ is independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment of the invention, the organic molecule comprises or consists of a structure of Formula I, wherein the exactly two second chemical moieties comprise a structure selected from the group consisting of Formulas IIa and IIb, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

N($C_6$-$C_{18}$-aryl)$_2$,

N($C_3$-$C_{17}$-heteroaryl)$_2$; and

N($C_3$-$C_{17}$-heteroaryl)($C_6$-$C_{18}$-aryl);

In one embodiment of the invention, the organic molecule comprises or consists of a structure of Formula I, wherein the exactly two second chemical moieties comprise a structure selected from the group consisting of Formulas IIa and IIb, wherein $R^2$ is at each occurrence independently from another selected from the group consisting of:

hydrogen, deuterium, $^i$Pr, and

Ph, which is optionally substituted with one or more Ph substituents.

In one embodiment of the invention, the organic molecule comprises or consists of a structure of Formula I, wherein the exactly two second chemical moieties comprise a structure selected from the group consisting of Formulas IIa and IIb, wherein $R^2$ is at each occurrence hydrogen.

In one embodiment of the invention, the organic molecule comprises or consists of a structure of Formula I, wherein the exactly two second chemical moieties comprise a structure selected from the group consisting of Formulas IIa and IIb, wherein R* is at each occurrence independently from another selected from the group consisting of:

hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula I, wherein the exactly two second chemical moieties comprise a structure selected from the group consisting of Formulas IIa and IIb, wherein R* is at each occurrence independently from another selected from the group consisting of:

hydrogen, deuterium, $^i$Pr, and

Ph, which is optionally substituted with one or more Ph substituents.

In one embodiment of the invention, the organic molecule comprises or consists of a structure of Formula I, wherein the exactly two second chemical moieties comprise a structure selected from the group consisting of Formulas IIa and IIb, wherein R* is at each occurrence hydrogen.

In one embodiment the organic molecule comprises or consists of a structure of Formula I, wherein the exactly two second chemical moieties consist of a structure of Formula IIa:

Formula IIa

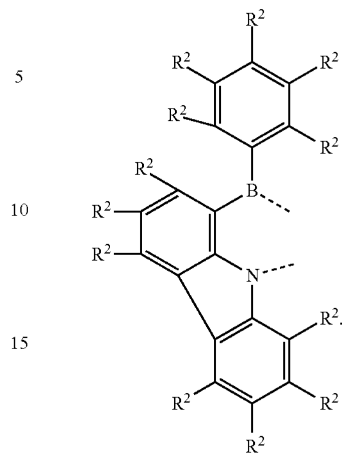

In one embodiment the organic molecule comprises or consists of a structure of Formula I, wherein the exactly two second chemical moieties consist of a structure of Formula IIb:

Formula IIb

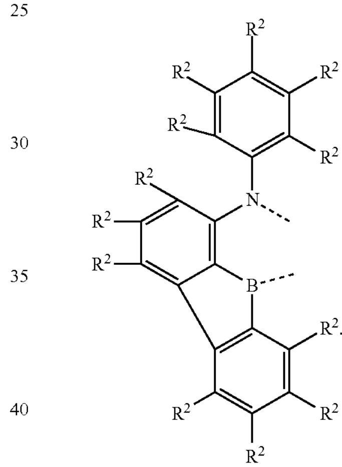

In one embodiment, the organic molecule comprises or consists of a structure of Formulas Ia-I, Ia-II, Ia-III and Ia-IV:

Formula Ia-I

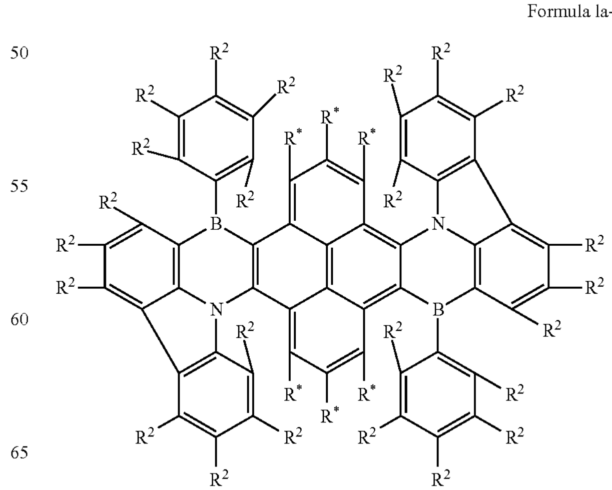

-continued

Formula Ia-II

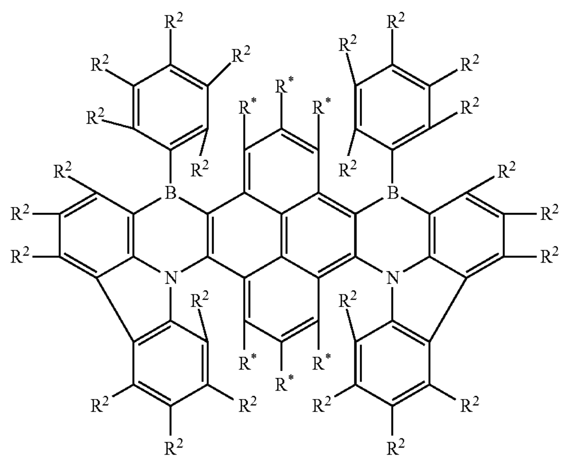

Formula Ia-III

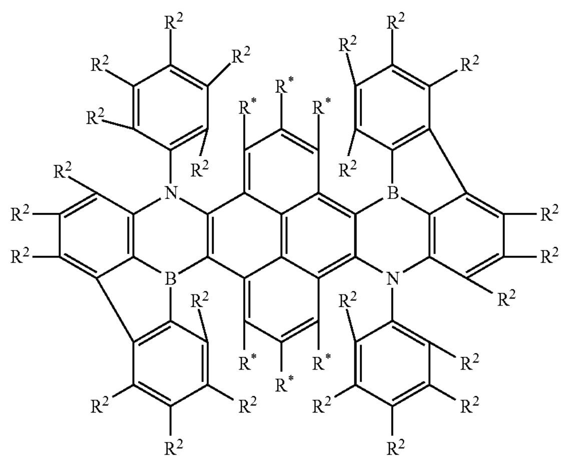

Formula Ia-IV

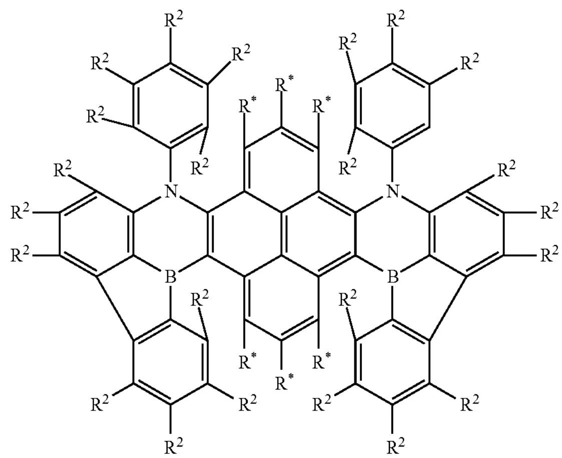

In one embodiment, the organic molecule comprises or consists of a structure selected from the group consisting of Formulas Ia-I, Ia-II, Ia-III and Ia-IV, wherein R* is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment of the invention, the organic molecule comprises or consists of a structure selected from the group consisting of Formulas Ia-I, Ia-II, Ia-III and Ia-IV, wherein $R^2$ is independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule comprises or consists of a structure selected from the group consisting of Formulas Ia-I, Ia-II, Ia-III and Ia-IV, wherein $R^2$ is independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment, the organic molecule comprises or consists of a structure selected from the group consisting of Formulas Ia-I, Ia-II, Ia-III and Ia-IV, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$, $N(C_3$-$C_{17}$-heteroaryl$)_2$; and $N(C_3$-$C_{17}$-heteroaryl)($C_6$-$C_{18}$-aryl).

In one embodiment, the organic molecule comprises or consists of a structure selected from the group consisting of Formulas Ia-I, Ia-II, Ia-III and Ia-IV, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ia-I, Ia-II, Ia-III and Ia-IV, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ia-I, Ia-II, Ia-III and Ia-IV, wherein $R^2$ is at each occurrence hydrogen.

In one embodiment, the organic molecule comprises or consists of a structure of Formulas Ia-I, Ia-II, Ia-III and Ia-IV, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ia-I, Ia-II, Ia-III and Ia-IV, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ia-I, Ia-II, Ia-III and Ia-IV, wherein R* is at each occurrence hydrogen.

In one embodiment, the organic molecule comprises or consists of a structure selected from the group consisting of Formulas Ia-I, Ia-II, Ia-III and Ia-IV, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ia-I, Ia-II, Ia-III and Ia-IV, wherein, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ia-I, Ia-II, Ia-III and Ia-IV, wherein $R^2$, and R* are at each occurrence hydrogen.

In one embodiment, the organic molecule comprises or consists of a structure selected from the group consisting of Formulas Ib-I, Ib-II, Ib-III and Ib-IV:

Formula Ib-1

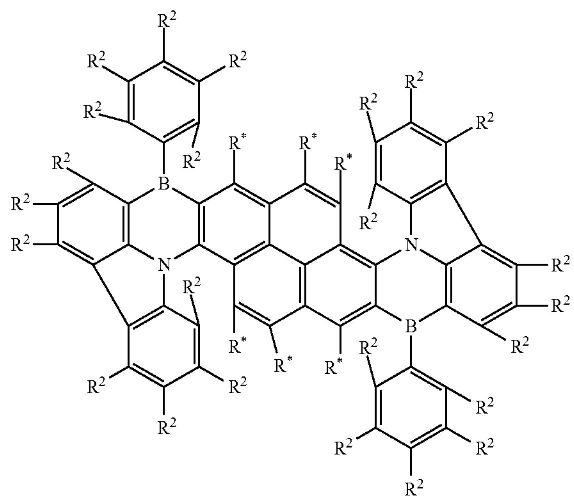

Formula Ib-II

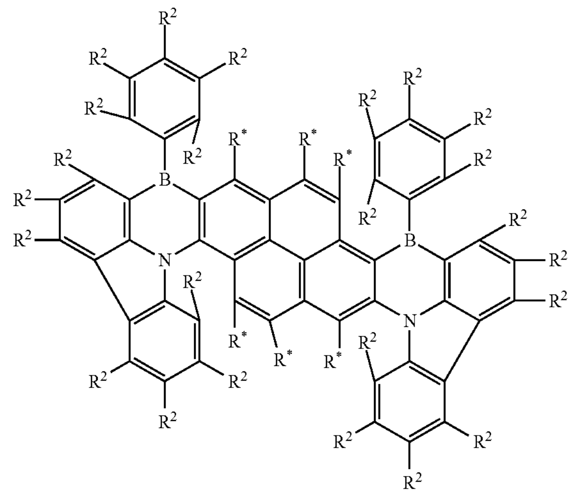

-continued

Formula Ib-III

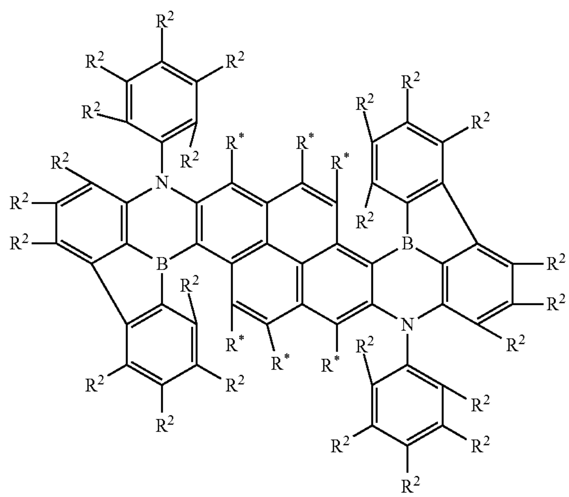

Formula Ib-IV

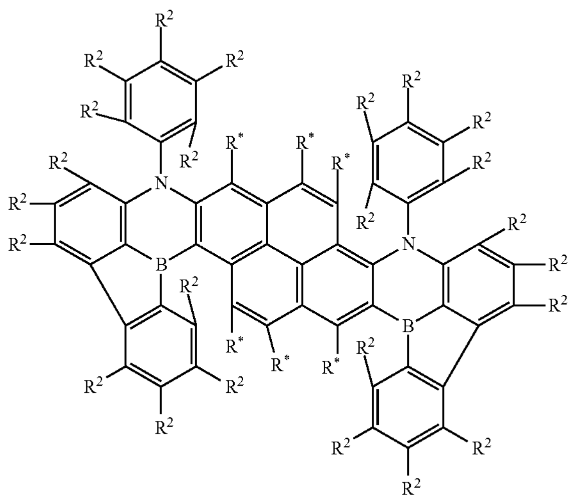

In one embodiment, the organic molecule comprises or consists of a structure selected from the group consisting of Formulas Ib-I, Ib-II, Ib-III and Ib-IV, wherein R* is at each occurrence independently from another selected from the group consisting of:

hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment of the invention, the organic molecule comprises or consists of a structure selected from the group consisting of Formulas Ib-I, Ib-II, Ib-III and Ib-IV, wherein $R^2$ is independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule comprises or consists of a structure selected from the group consisting of Formulas Ib-I, Ib-II, Ib-III and Ib-IV, wherein $R^2$ is independently selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In one embodiment, the organic molecule comprises or consists of a structure selected from the group consisting of Formulas Ib-I, Ib-II, Ib-III and Ib-IV, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$, $N(C_3$-$C_{17}$-heteroaryl$)_2$; and $N(C_3$-$C_{17}$-heteroaryl$)(C_6$-$C_{18}$-aryl);

In one embodiment, the organic molecule comprises or consists of a structure selected from the group consisting of Formulas Ib-I, Ib-II, Ib-III and Ib-IV, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ib-I, Ib-II, Ib-III and Ib-IV, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ib-I, Ib-II, Ib-III and Ib-IV, wherein $R^2$ is at each occurrence hydrogen.

In one embodiment, the organic molecule comprises or consists of a structure selected from the group consisting of Formulas Ib-I, Ib-II, Ib-III and Ib-IV, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ib-I, Ib-II, Ib-III and Ib-IV, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ib-I, Ib-II, Ib-III and Ib-IV, wherein R* are at each occurrence hydrogen.

In one embodiment, the organic molecule comprises or consists of a structure selected from the group consisting of Formulas Ib-I, Ib-II, Ib-III and Ib-IV, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure selected from the group consisting of Formulas Ib-I, Ib-II, Ib-III and Ib-IV, wherein, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure selected from the group consisting of Formulas Ib-I, Ib-II, Ib-III and Ib-IV, wherein $R^2$, and R* are at each occurrence hydrogen.

In one embodiment, the organic molecule comprises or consists of a structure of Formula Iaa:

Formula Iaa

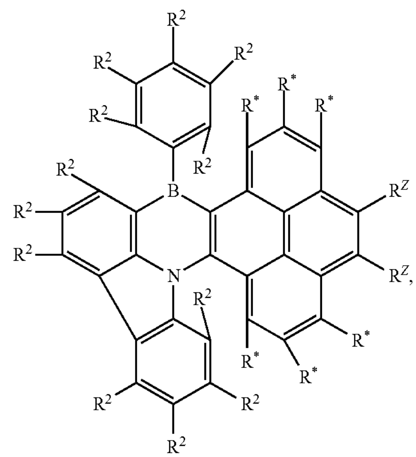

wherein $R^Z$ are the binding sites of a single bond linking the first chemical moiety to the second moiety Formula IIa.

In one embodiment, the organic molecule comprises or consists of a structure of Formula Iaa, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula Iaa, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule comprises or consists of a structure of Formula Iaa, wherein $R^2$ is independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment, the organic molecule comprises or consists of a structure of Formula Iaa, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$.

In one embodiment, the organic molecule comprises or consists of a structure of Formula Iaa, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iaa, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iaa, wherein $R^2$ is at each occurrence hydrogen.

In one embodiment, the organic molecule comprises or consists of a structure of Formula Iaa, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iaa, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iaa, wherein R* is at each occurrence hydrogen.

In one embodiment, the organic molecule comprises or consists of a structure of Formula Iaa, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iaa, wherein, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iaa, wherein $R^2$, and R* are at each occurrence hydrogen.

In one embodiment, the organic molecule comprises or consists of a structure of Formula Ia-I:

Formula Ia-I

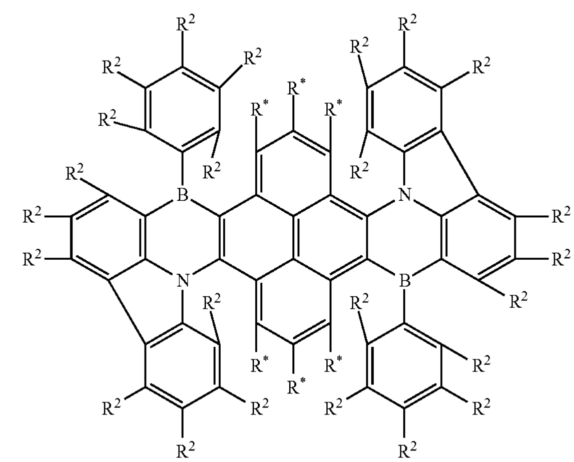

In one embodiment, the organic molecule comprises or consists of a structure of Formula Ia-II:

Formula Ia-II

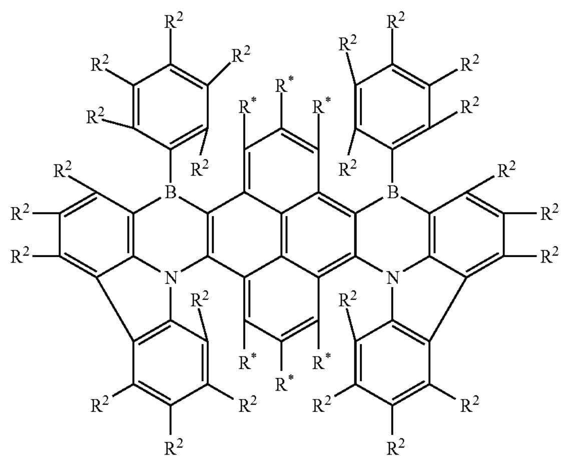

In one embodiment, the organic molecule comprises or consists of a structure of Formula Iba:

Formula Iba

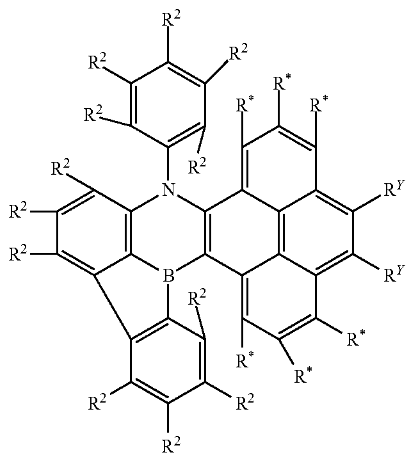

wherein $R^Y$ are the binding sites of a single bond linking the first chemical moiety to the second moiety of Formula IIb.

In one embodiment, the organic molecule comprises or consists of a structure of Formula Iba, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula Iba, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule comprises or consists of a structure of Formula Iba, wherein $R^2$ is independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment, the organic molecule comprises or consists of a structure of Formula Iba, wherein $R^2$ is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6-C_{18}\text{-aryl})_2$, $N(C_3-C_{17}\text{-heteroaryl})_2$; and $N(C_3-C_{17}\text{-heteroaryl})(C_6-C_{18}\text{-aryl})$.

In one embodiment, the organic molecule comprises or consists of a structure of Formula Iba, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iba, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iba, wherein $R^2$ is at each occurrence hydrogen.

In one embodiment, the organic molecule comprises or consists of a structure of Formula Iba, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iba, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iba, wherein R* is at each occurrence hydrogen.

In one embodiment, the organic molecule comprises or consists of a structure of Formula Iba, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iba, wherein, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iba, wherein $R^2$, and R* are at each occurrence hydrogen.

In one embodiment, the organic molecule comprises or consists of a structure of Formula Ia-III:

Formula Ia-III

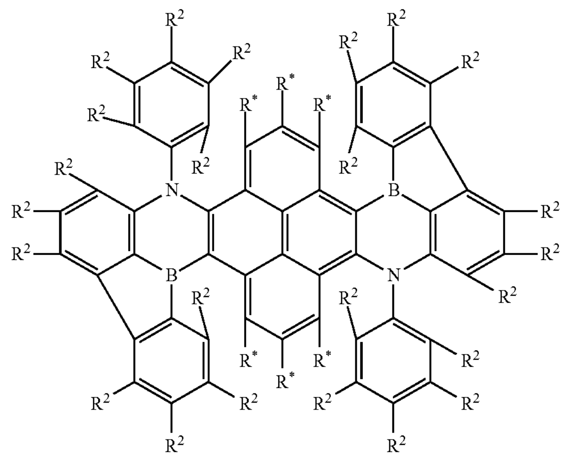

In one embodiment, the organic molecule comprises or consists of a structure of Formula Ia-IV:

Formula Ia-IV

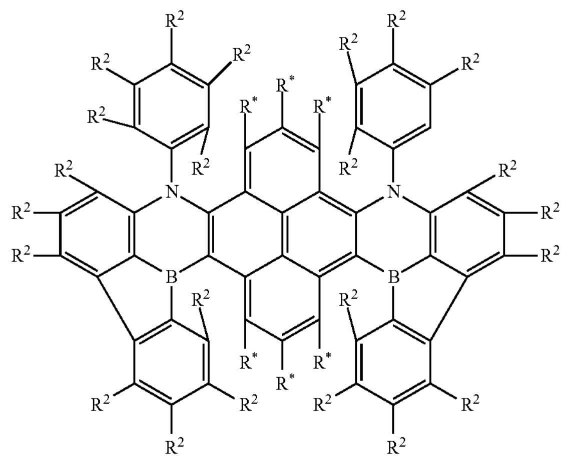

In one embodiment, the organic molecule comprises or consists of a structure of Formula Iba:

Formula Iba

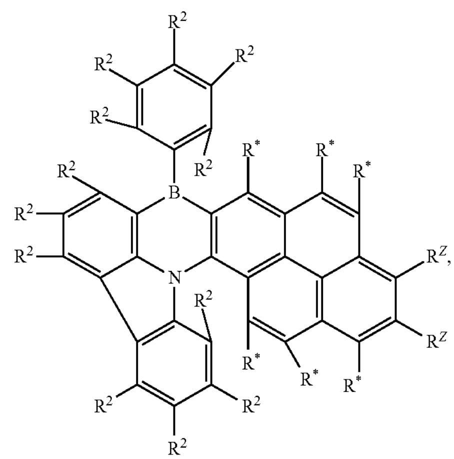

wherein $R^Z$ are binding sites of a single bond linking the first chemical moiety to the second moiety Formula IIa.

In one embodiment, the organic molecule comprises or consists of a structure of Formula Iba, wherein R* is are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In one embodiment of the invention, the organic molecule comprises or consists of a structure of Formula Iba, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule comprises or consists of a structure of Formula Iba, wherein $R^2$ is independently selected from the group consisting of:

hydrogen,

Me, $^i$Pr, $^t$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment, the organic molecule comprises or consists of a structure of Formula Iba, wherein $R^2$ is at each occurrence independently from another selected from the group consisting of hydrogen, deuterium, OPh, SPh, $CF_3$, CN, F, $Si(C_1-C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$.

In one embodiment, the organic molecule comprises or consists of a structure of Formula Iba, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iba, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iba, wherein $R^2$ is at each occurrence hydrogen.

In one embodiment, the organic molecule comprises or consists of a structure of Formula Iba, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Iba, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Iba, wherein R* is at each occurrence hydrogen.

In one embodiment, the organic molecule comprises or consists of a structure of Formula Iba, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^{i}$Pr, $^{t}$Bu, and Ph.

In a preferred embodiment, the organic molecule comprises or consists of a structure of Formula Iba wherein, wherein $R^2$, and R* are at each occurrence independently from another selected from the group consisting of:

hydrogen, deuterium, $^{i}$Pr, and

Ph, which is optionally substituted with one or more Ph substituents.

In a certain embodiment the organic molecule comprises or consists of a structure of Formula Iba, wherein $R^2$, and R* are at each occurrence hydrogen.

In one embodiment, the organic molecule comprises or consists of a structure of Formula Ib-I:

Formula Ib-I

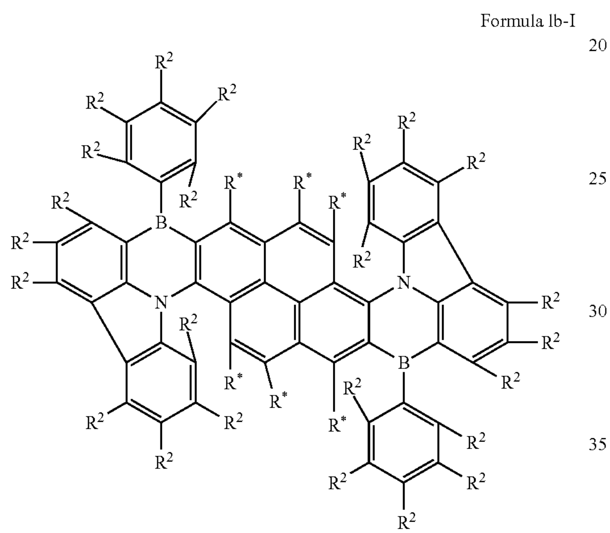

In one embodiment, the organic molecule comprises or consists of a structure of Formula Ib-II:

Formula Ib-II

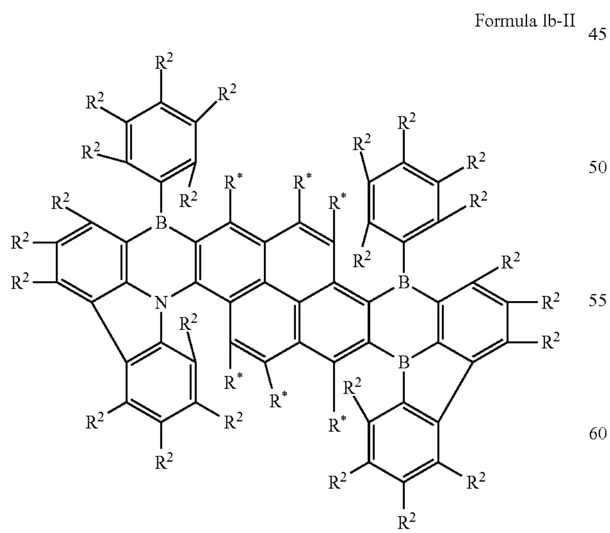

In one embodiment, the organic molecule comprises or consists of a structure of Formula Ibb:

Formula Ibb

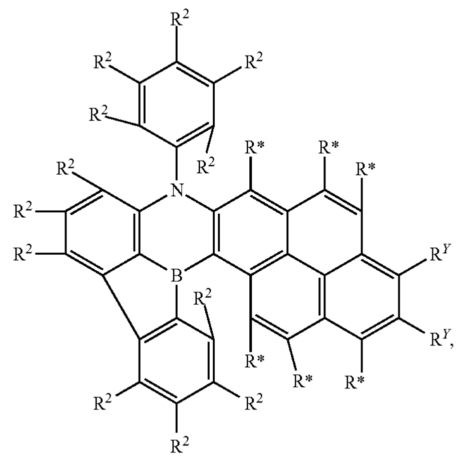

wherein $R^Y$ are the binding sites of a single bond linking the first chemical moiety to the second moiety of Formula IIb.

In one embodiment, the organic molecule comprises or consists of a structure of Formula Ibb, wherein R* is at each occurrence independently from another selected from the group consisting of:

Hydrogen, deuterium, Me, $^{i}$Pr, $^{t}$Bu, $SiMe_3$, $SiPh_3$, and

Ph, which is optionally substituted with one or more substituents independently from each other selected from the group consisting of Me, $^{i}$Pr, $^{t}$Bu, and Ph.

In one embodiment of the invention, the organic molecule comprises or consists of a structure of Formula Ibb, wherein $R^2$ is independently from another selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule comprises or consists of a structure of Formula Ibb, wherein $R^2$ is independently from another selected from the group consisting of:

hydrogen,

Me, $^{i}$Pr, $^{t}$Bu,

CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment, the organic molecule comprises or consists of a structure of Formula Ibb, wherein $R^2$ is at each occurrence independently from another selected from the group consisting of hydrogen, deuterium, OPh, SPh, $CF_3$, CN, F, $Si(C_1-C_5\text{-alkyl})_3$, $Si(Ph)_3$, $C_1$-$C_5$-alkyl, wherein optionally one or more hydrogen atoms are independently from each other substituted by deuterium (D), CN, $CF_3$, or F;

$C_1$-$C_5$-alkoxy, wherein optionally one or more hydrogen atoms are independently from each other substituted by deuterium, CN, $CF_3$, or F;

$C_1$-$C_5$-thioalkoxy, wherein optionally one or more hydrogen atoms are independently from each other substituted by deuterium, CN, $CF_3$, or F;

$C_2$-$C_5$-alkenyl, wherein optionally one or more hydrogen atoms are independently from each other substituted by deuterium, CN, $CF_3$, or F;

$C_2$-$C_5$-alkynyl, wherein optionally one or more hydrogen atoms are independently from each other substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6\text{-}C_{18}\text{-aryl})_2$, $N(C_3\text{-}C_{17}\text{-heteroaryl})_2$; and $N(C_3\text{-}C_{17}\text{-heteroaryl})(C_6\text{-}C_{18}\text{-aryl})$.

In one embodiment, the organic molecule comprises or consists of a structure of Formula Ibb, wherein $R^2$ is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ibb, wherein $R^2$ is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ibb, wherein $R^2$ is at each occurrence hydrogen.

In one embodiment, the organic molecule comprises or consists of a structure of Formula Ibb, wherein R* is at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ibb, wherein R* is at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ibb, wherein R* is at each occurrence hydrogen.

In one embodiment, the organic molecule comprises or consists of a structure of Formula Ibb, wherein $R^2$, and R* are at each occurrence independently from another selected from the group consisting of:

Hydrogen, deuterium, Me, $^i$Pr, $^t$Bu, $SiMe_3$, $SiPh_3$, and

Ph, which is optionally substituted with one or more substituents independently from each other selected from the group consisting of Me, $^i$Pr, $^t$Bu, and Ph.

In a preferred embodiment, the organic molecule comprises or consists of a structure of Formula Ibb wherein, wherein $R^2$, and R* are at each occurrence independently from another selected from the group consisting of:

hydrogen, deuterium, $^i$Pr, and

Ph, which is optionally substituted with one or more Ph substituents.

In a certain embodiment the organic molecule comprises or consists of a structure of Formula Ibb, wherein $R^2$, and R* are at each occurrence hydrogen.

In one embodiment, the organic molecule comprises or consists of a structure of Formula Ib-III:

Formula Ib-III

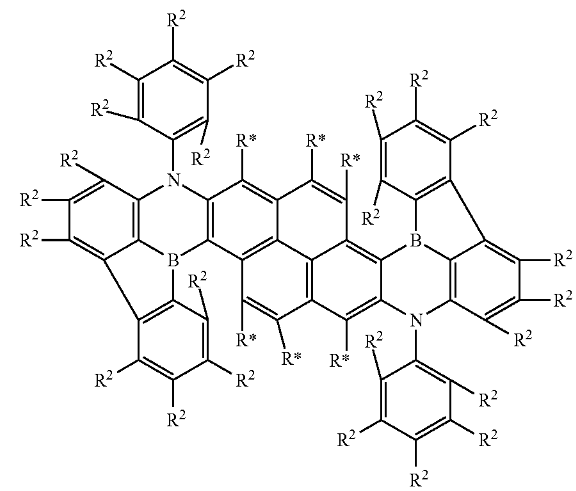

In one embodiment, the organic molecule comprises or consists of a structure of Formula Ib-IV:

Formula Ib-IV

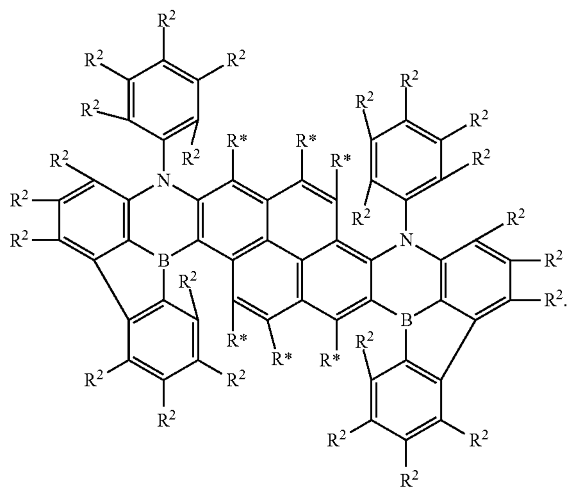

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used here throughout, the term "aryl group or heteroaryl group" comprises groups which can be bound via any position of the aromatic or heteroaromatic group, derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-triazine, quinoxaline, pyrazine, phenazine, naphthyridine, carboline, benzocarboline, phenanthroline, 1,2,3-triazole, 1,2,4-triazole, benzotriazole, 1,2,3-oxadiazole, 1,2,4-oxadiazole, 1,2,5-oxadiazole, 1,2,3,4-tetrazine, purine, pteridine, indolizine and benzothiadiazole or combinations of the abovementioned groups.

As used here throughout, the term "cyclic group" may be understood in the broadest sense as any mono-, bi- or polycyclic moieties.

As used here throughout, the term "biphenyl" as a substituent may be understood in the broadest sense as ortho-biphenyl, meta-biphenyl, or para-biphenyl, wherein ortho, meta and para is defined in regard to the binding site to another chemical moiety.

As used here throughout, the term "terphenyl" as a substituent may be understood in the broadest sense as 3-ortho-terphenyl, 4-ortho-terphenyl, 4-meta-terphenyl, 5-meta-terphenyl, 2-para-terphenyl or 3-para-terphenyl, wherein ortho, meta and para is defined in regard to the position of the Ph moieties to each other and "2-", "3-", "4-" and "5-" is defined in regard to the binding site to another chemical moiety, i.e.:

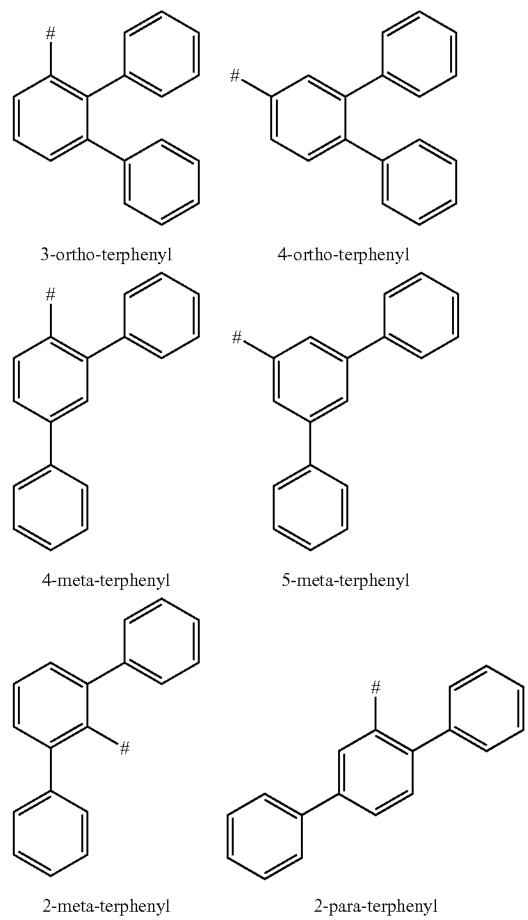

3-ortho-terphenyl 4-ortho-terphenyl 4-meta-terphenyl 5-meta-terphenyl 2-meta-terphenyl 2-para-terphenyl wherein #indicates the binding site to another chemical moiety.

As used here throughout, the term "naphthyl" as a naphthalene substituent may be understood in the broadest sense as 1-naphthyl and 2-naphthyl, wherein "1-" and "2-" is defined in regard to the binding site to another chemical moiety, i.e.:

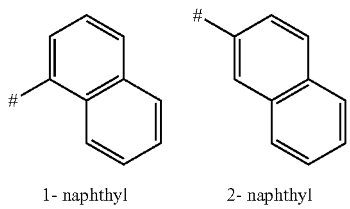

1- naphthyl 2- naphthyl wherein #indicates the binding site to another chemical moiety.

As used here throughout, the term "anthracene" as a substituent may be understood in the broadest sense as 1-anthracenyl, 2-anthracenyl and 9-anthracenyl wherein "1-", "2-" and "9-" is defined in regard to the binding site to another chemical moiety, i.e.:

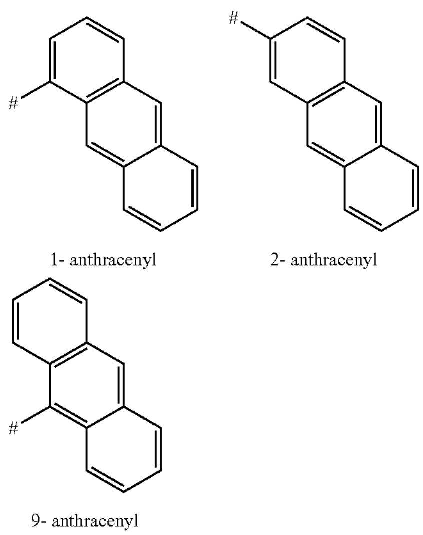

1- anthracenyl 2- anthracenyl 9- anthracenyl wherein #indicates the binding site to another chemical moiety.

As used here throughout, the term "alkyl group" may be understood in the broadest sense as any linear, branched, or cyclic alkyl substituent. In particular, the term alkyl comprises the substituents methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl) octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and 1-(n-decyl)-cyclohex-1-yl.

As used throughout, the term "alkenyl" comprises linear, branched, and cyclic alkenyl substituents. The term "alkenyl group", for example, comprises the substituents ethenyl, propenyl, butenyl, pentenyl, cyclopentenyl, hexenyl, cyclohexenyl, heptenyl, cycloheptenyl, octenyl, cyclooctenyl or cyclooctadienyl.

As used throughout, the term "alkynyl" comprises linear, branched, and cyclic alkynyl substituents. The term "alkynyl group", for example, comprises ethynyl, propynyl, butynyl, pentynyl, hexynyl, heptynyl or octynyl.

As used throughout, the term "alkoxy" comprises linear, branched, and cyclic alkoxy substituents. The term "alkoxy group" exemplarily comprises methoxy, ethoxy, n-propoxy, i-propoxy, n-butoxy, i-butoxy, s-butoxy, t-butoxy and 2-methylbutoxy.

As used throughout, the term "thioalkoxy" comprises linear, branched, and cyclic thioalkoxy substituents, in which the O of the exemplarily alkoxy groups is replaced by S.

As used throughout, the terms "halogen" and "halo" may be understood in the broadest sense as being preferably fluorine, chlorine, bromine or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In one embodiment of the invention, the organic molecules according to the invention have an emission peak in the visible or nearest ultraviolet range, i.e., in the range of a wavelength of from 380 nm to 800 nm, with a full width at half maximum of less than 0.35 eV, preferably less than 0.30 eV, more preferably less than 0.26 eV, even more preferably less than 0.22 eV or even less than 0.18 eV with 0.001 mg/mL in DCM of organic molecule at room temperature.

The energy of the first excited triplet state T1 is determined from the onset of the emission spectrum at low temperature, typically at 77 K. The phosphorescence is usually visible in a steady-state spectrum in a film of 2% emitter and 98% PMMA. The triplet energy can thus be determined as the onset of the phosphorescence spectrum. For Fluorescent emitter molecules, the energy of the first excited triplet state T1 is determined from the onset of the delayed emission spectrum at 77 K.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

In one embodiment, the organic molecules according to the invention have an onset of the emission spectrum, which is energetically close to the emission maximum, i.e. the energy difference between the onset of the emission spectrum and the energy of the emission maximum is below 0.14 eV, preferably below 0.13 eV, or even below 0.12 eV, while the full width at half maximum (FWHM) of the organic molecules is less than 0.35 eV, preferably less than 0.30 eV, more preferably less than 0.26 eV, even more preferably less than 0.22 eV or even less than 0.18 eV with 0.001 mg/mL in DCM of organic molecule at room temperature, resulting in a CIEy coordinate below 0.20, preferably below 0.18, more preferably below 0.16 or even more preferred below 0.14.

A further aspect of the invention relates to the use of an organic molecule of the invention as a luminescent emitter or as an absorber, and/or as a host material and/or as an electron transport material, and/or as a hole injection material, and/or as a hole blocking material in an optoelectronic device.

A preferred embodiment relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e. in the range of a wavelength of from 380 to 800 nm. More preferably, the optoelectronic device may be able to emit light in the visible range, i.e. light of from 400 nm to 800 nm.

In the context of such use, the optoelectronic device is more particularly selected from the group consisting of:

organic light-emitting diodes (OLEDs),
light-emitting electrochemical cells,
OLED sensors, especially in gas and vapor sensors that are not hermetically shielded to the surroundings,
organic diodes,
organic solar cells,
organic transistors,
organic field-effect transistors,
organic lasers, and
down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in an OLED, is 0.1% to 99% by weight, more particularly 1% to 80% by weight. In an alternative embodiment, the proportion of the organic molecule in the emission layer is 100% by weight.

In one embodiment, the light-emitting layer comprises not only the organic molecules according to the invention, but also a host material whose triplet (T1) and singlet (S1) energy levels are energetically higher than the triplet (T1) and singlet (S1) energy levels of the organic molecule.

A further aspect of the invention relates to a composition comprising or consisting of:

(a) at least one organic molecule according to the invention, in particular in the form of an emitter, and
(b) one or more triplet-triplet annihilation (TTA) host materials, which differ from the organic molecule according to the invention and
(c) optionally one or more TADF materials
(d) optionally one or more dyes and/or one or more solvents.

A further aspect of the invention relates to a composition comprising or consisting of:

(a) at least one organic molecule according to the invention, in particular in the form of an emitter, and
(b) one or more host materials, which differ from the organic molecule according to the invention and
(c) one or more TADF materials.

A further aspect of the invention relates to a composition comprising or consisting of:

(a) at least one organic molecule according to the invention, in particular in the form of an emitter, and
(b) one or more host materials, which differ from the organic molecule according to the invention and
(c) one or more phosphorescent materials.

In a particular embodiment, the light-emitting layer EML comprises (or essentially consists of) a composition comprising or consisting of:

(i) 0.1-10% by weight, preferably 0.5-5% by weight, in particular 1-3% by weight, of one or more organic molecules according to the invention;
(ii) 5-99% by weight, preferably 15-85% by weight, in particular 20-75% by weight, of at least one host compound H; and
(iii) 0.9-94.9% by weight, preferably 14.5-80% by weight, in particular 24-77% by weight, of at least one further host compound D with a structure differing from the structure of the molecules according to the invention; and
(iv) optionally 0-94% by weight, preferably 0-65% by weight, in particular 0-50% by weight, of a solvent; and
(v) optionally 0-30% by weight, in particular 0-20% by weight, preferably 0-5% by weight, of at least one further emitter molecule F with a structure differing from the structure of the molecules according to the invention.

Compositions with One or More TTA Host Material

In a preferred embodiment, in the optoelectronic device of the present invention, the light-emitting layer B comprises (or consist of):

(i) 10-84% by weight of the TTA material $H^N$;
(ii) 0-30% by weight of the TADF material $E^B$; and
(iii) 0.1-10% by weight of the emitter according to the invention; and optionally
(iv) 0-74% by weight of one or more solvents.

In a preferred embodiment, the percentage numbers of (i)-(iv) sum up to 100% by weight.

In another preferred embodiment, in the optoelectronic device of the present invention, the light-emitting layer B comprises (or consist of):

(i) 56-90% by weight of the TTA material $H^N$;
(ii) 0-5% by weight of the TADF material $E^B$; and
(iii) 0.5-5% by weight of the emitter according to the invention; and optionally
(iv) 0-34% by weight of one or more solvents.

In a preferred embodiment, the percentage numbers of (i)-(iv) sum up to 100% by weight.

Compositions with One or More TADF Material

In one embodiment, the light-emitting layer B comprises:

(i) 10-89.9% by weight of one or more p-host compound $H^P$;
(ii) 0-79.9% by weight of one or more n-host compound $H^N$;
(iii) 10-50% by weight of one or more TADF material $E^B$; and
(iv) 0.1-10% by weight of one or more emitter according to the invention; and
(v) 0-79.9% by weight of one or more solvents.

In one embodiment, the light-emitting layer B comprises:

(i) 22-87.5% by weight of one or more p-host compound $H^P$;
(ii) 0-65.5% by weight of one or more n-host compound $H^N$;
(iii) 12-40% by weight of one or more TADF material $E^B$; and
(iv) 0.5-5% by weight of one or more emitter according to the invention; and (v) 0-65.5% by weight of one or more solvents.

Compositions with One or More Phosphorescent Material

In a preferred embodiment where $H^N$ is optional, in the optoelectronic device of the present invention, the light-emitting layer B comprises (or consists of):

(i) 10-84.9% by weight of the host compound $H^P$;

(ii) 0-84.9% by weight of the host compound $H^N$;

(iii) 5-15% by weight of the Phosphorescence material $E^B$; and (iv) 0.1-10% by weight of the emitter according to the invention; and optionally (v) 0-84.9% by weight of one or more solvents.

In a preferred embodiment where $H^N$ is optional, in the optoelectronic device of the present invention, the light-emitting layer B comprises (or consists of):

(i) 22-70.5% by weight of the host compound $H^P$;

(ii) 0-72.5% by weight of the host compound $H^N$;

(iii) 5-10% by weight of the phosphorescence material $E^B$; and (iv) 0.5-5% by weight of the emitter according to the invention; and optionally (v) 0-72.5% by weight of one or more solvents.

Preferably, energy can be transferred from the host compound H to the one or more organic molecules according to the invention, in particular transferred from the first excited triplet state T1(H) of the host compound H to the first excited triplet state T1(E) of the one or more organic molecules according to the invention E and/or from the first excited singlet state S1(H) of the host compound H to the first excited singlet state S1(E) of the one or more organic molecules according to the invention E.

In one embodiment, the host compound H has a highest occupied molecular orbital HOMO(H) having an energy $E^{HOMO}$(H) in the range of from −5 to −6.5 eV and the at least one further host compound D has a highest occupied molecular orbital HOMO(D) having an energy $E^{HOMO}$(D), wherein $E^{HOMO}(H)>E^{HOMO}(D)$.

In a further embodiment, the host compound H has a lowest unoccupied molecular orbital LUMO(H) having an energy $E^{LUMO}$(H) and the at least one further host compound D has a lowest unoccupied molecular orbital LUMO(D) having an energy $E^{LUMO}$(D) wherein $E^{LUMO}(H)>E^{LUMO}(D)$.

In one embodiment, the host compound H has a highest occupied molecular orbital HOMO(H) having an energy $E^{HOMO}$(H) and a lowest unoccupied molecular orbital LUMO(H) having an energy $E^{LUMO}$(H), and the at least one further host compound D has a highest occupied molecular orbital HOMO(D) having an energy $E^{HOMO}$(D) and a lowest unoccupied molecular orbital LUMO(D) having an energy $E^{LUMO}$(D), the organic molecule according to the invention E has a highest occupied molecular orbital HOMO(E) having an energy $E^{HOMO}$(E) and a lowest unoccupied molecular orbital LUMO(E) having an energy $E^{LUMO}$(E), wherein $E^{HOMO}(H)>E^{HOMO}(D)$ and the difference between the energy level of the highest occupied molecular orbital HOMO(E) of the organic molecule according to the invention E ($E^{HOMO}$(E)) and the energy level of the highest occupied molecular orbital HOMO(H) of the host compound H ($E^{HOMO}$(H)) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of the organic molecule according to the invention E ($E^{LUMO}$(E)) and the energy level of the lowest unoccupied molecular orbital LUMO(D) of the at least one further host compound D ($E^{LUMO}$(D)) is between −0.5 eV and 0.5 eV, more preferably between −0.3 eV and 0.3 eV, even more preferably between −0.2 eV and 0.2 eV or even between −0.1 eV and 0.1 eV.

In one embodiment of the invention the host compound D and/or the host compound H is a thermally-activated delayed fluorescence (TADF)-material. TADF materials exhibit a LEST value, which corresponds to the energy difference between the first excited singlet state (S1) and the first excited triplet state (T1), of less than 2500 $cm^{-1}$. Preferably the TADF material exhibits a LEST value of less than 3000 $cm^{-1}$, more preferably less than 1500 $cm^{-1}$, even more preferably less than 1000 $cm^{-1}$ or even less than 500 $cm^{-1}$.

In one embodiment, the host compound D is a TADF material and the host compound H exhibits a LEST value of more than 2500 $cm^{-1}$. In a particular embodiment, the host compound D is a TADF material and the host compound H is selected from group consisting of CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In a particular embodiment, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

In a further aspect, the invention relates to an optoelectronic device comprising an organic molecule or a composition of the type described here, more particularly in the form of a device selected from the group consisting of organic light-emitting diode (OLED), light-emitting electrochemical cell, OLED sensor (particularly gas and vapor sensors not hermetically externally shielded), organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer, A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, C wherein the OLED comprises each layer selected from the group of HIL, HTL, EBL, HBL, ETL, and EIL only optionally, different layers may be merged and the OLED may comprise more than one layer of each layer type defined above.

Furthermore, the optoelectronic device may, in one embodiment, comprise one or more protective layers protecting the device from damaging exposure to harmful species in the environment including, for example, moisture, vapor and/or gases.

In one embodiment of the invention, the optoelectronic device is an OLED, with the following inverted layer structure:

1. substrate
2. cathode layer, C
3. electron injection layer, EIL
4. electron transport layer, ETL
5. hole blocking layer, HBL
6. emitting layer, B
7. electron blocking layer, EBL
8. hole transport layer, HTL
9. hole injection layer, HIL
10. anode layer, A wherein the OLED comprises each layer selected from the group of HIL, HTL, EBL, HBL, ETL, and EIL only optionally, different layers may be merged and the OLED may comprise more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may comprise a charge generation layer (CGL), which is typically located between two OLED subunits and typically consists of an n-doped layer and a p-doped layer with the n-doped layer of one CGL being typically located closer to the anode layer.

In one embodiment of the invention, the optoelectronic device is an OLED, which comprises two or more emission layers between anode and cathode. In particular, this so-called tandem OLED comprises three emission layers, wherein one emission layer emits red light, one emission layer emits green light and one emission layer emits blue light, and optionally may comprise further layers such as charge generation layers, blocking or transporting layers between the individual emission layers. In a further embodiment, the emission layers are adjacently stacked. In a further embodiment, the tandem OLED comprises a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A comprises a large content or even consists of transparent conductive oxides (TCOs). Such anode layer A may, for example, comprise indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrol and/or doped polythiophene.

The anode layer A (essentially) may consist of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylenedioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may, for example, comprise PEDOT:PSS (poly-3,4-ethylenedioxy thiophene:polystyrene sulfonate), PEDOT (poly-3,4-ethylenedioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenyl-amino)phenyl]benzidine), MeO-TPD (N,N,N',N'-tetrakis(4-methoxyphenyl)benzidine), HAT-CN (1,4,5,8,9,11-hexaazatriphenylen-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may comprise a star-shaped heterocycle such as tris(4-carbazoyl-9-ylphenyl)amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4"-tris[2-naphthyl(phenyl)amino]triphenylamine), Spiro-TAD, DNTPD, NPB, NPNPB, MeO-TPD, HAT-CN and/or TrisPcz (9,9'-diphenyl-6-(9-phenyl-9H-carbazol-3-yl)-9H,9'H-3,3'-bicarbazole). In addition, the HTL may comprise a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane ($F_4$-TCNQ), copper-pentafluorobenzoate (Cu(I)pFBz) or transition metal complexes may, for example, be used as organic dopant.

The EBL may, for example, comprise mCP (1,3-bis(carbazol-9-yl)benzene), TCTA, 2-TNATA, mCBP (3,3-di(9H-carbazol-9-yl)biphenyl), tris-Pcz, CzSi (9-(4-tert-Butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML comprises at least one light emitting molecule.

Particularly, the EML comprises at least one light emitting molecule according to the invention E. In one embodiment, the light-emitting layer comprises only the organic molecules according to the invention. Typically, the EML additionally comprises one or more host materials H. For example, the host material H is selected from CBP (4,4'-Bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl] ether oxide), 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

In one embodiment of the invention, the EML comprises a so-called mixed-host system with at least one hole-dominant host and one electron-dominant host. In a particular embodiment, the EML comprises exactly one light emitting organic molecule according to the invention and a mixed-host system comprising T2T as electron-dominant host and a host selected from CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as hole-dominant host. In a further embodiment the EML comprises 50-80% by weight, preferably 60-75% by weight of a host selected from CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, electron-poor compounds such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tri(1-phenyl-1H-benzo[d]imidazol-2-yl)phenyl (TPBi). The ETL may comprise NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a hole blocking layer (HBL) is introduced.

The HBL may, for example, comprise BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris(carbazol)-9-yl) benzene).

Adjacent to the electron transport layer (ETL), a cathode layer C may be located. The cathode layer C may, for example, comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) in transparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also comprise one or more host compounds H.

In order to modify the emission spectrum and/or the absorption spectrum of the light-emitting layer EML further, the light-emitting layer EML may further comprise one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such white optoelectronic device may comprise at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, and a red emitter has an emission maximum in a range of from >620 to 800 nm.

A green emitter may preferably have an emission maximum between 500 and 560 nm, more preferably between 510 and 550 nm, and even more preferably between 520 and 540 nm.

A further embodiment of the present invention relates to an OLED, which emits light with CIEx and CIEy color coordinates close to the CIEx (=0.170) and CIEy (=0.797) color coordinates of the primary color green (CIEx=0.170 and CIEy=0.797) as defined by ITU-R Recommendation BT.2020 (Rec. 2020) and thus is suited for the use in Ultra High Definition (UHD) displays, e.g. UHD-TVs. In this context, the term "close to" refers to the ranges of CIEx and CIEy coordinates provided at the end of this paragraph. In commercial applications, typically top-emitting (top-electrode is transparent) devices are used, whereas test devices as used throughout the present application represent bottom-emitting devices (bottom-electrode and substrate are transparent). Accordingly, a further aspect of the present invention relates to an OLED, whose emission exhibits a CIEx color coordinate of between 0.06 and 0.34, preferably between 0.07 and 0.29, more preferably between 0.09 and 0.24 or even more preferably between 0.12 and 0.22 or even between 0.14 and 0.19 and/or a CIEy color coordinate of between 0.44 and 0.84, preferably between 0.55 and 0.83, more preferably between 0.65 and 0.82 or even more preferably between 0.70 and 0.81 or even between 0.75 and 0.8.

Accordingly, a further aspect of the present invention relates to an OLED, which exhibits an external quantum efficiency at 14500 cd/$m^2$ of more than 10%, more preferably of more than 13%, more preferably of more than 15%, even more preferably of more than 17% or even more than 20% and/or exhibits an emission maximum between 495 nm and 580 nm, preferably between 500 nm and 560 nm, more preferably between 510 nm and 550 nm, even more preferably between 515 nm and 540 nm A deep blue emitter may preferably have an emission maximum of below 480 nm, more preferably below 470 nm, even more preferably below 465 nm or even below 460 nm. It will typically be above 420 nm, preferably above 430 nm, more preferably above 440 nm or even above 450 nm.

Accordingly, a further aspect of the present invention relates to an OLED, which exhibits an external quantum efficiency at 1000 cd/$m^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/$m^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of less than 0.45, preferably less than 0.30, more preferably less than 0.20 or even more preferably less than 0.15 or even less than 0.10.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of less than 0.30 eV, preferably less than 0.25 eV, more preferably less than 0.20 eV, even more preferably less than 0.19 eV or even less than 0.17 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In a further aspect, the invention relates to a method for producing an optoelectronic component. In this case an organic molecule of the invention is used.

The optoelectronic device, in particular the OLED according to the present invention can be fabricated by any means of vapor deposition and/or liquid processing. Accordingly, at least one layer is

- prepared by means of a sublimation process,
- prepared by means of an organic vapor phase deposition process,
- prepared by means of a carrier gas sublimation process,
- solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, comprise thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, comprise spin coating, dip coating and jet printing. Liquid processing may optionally be carried out in an inert atmosphere (e.g., in a nitrogen atmosphere) and the solvent may be completely or partially removed by means known in the state of the art.

EXAMPLES

General Synthesis Scheme I

General synthesis scheme I provides a synthesis scheme for organic molecules according to the invention wherein $R^{III}$=$R^{VIII}$; $R^{IV}$, $R^{VII}$, and $R^{IX}$ are hydrogen, adjacent substituents $R^{V}$ and $R^{VI}$, represent the binding sites of single bonds linking the first chemical moiety to the second chemical moiety to form a ring, and two adjacent substituents $R^{X}$ and $R^{I}$; represent the binding sites of single bonds linking the first chemical moiety to another (i.e., a second) second chemical moiety to form a ring with X═B, Y═N and o and p=0:

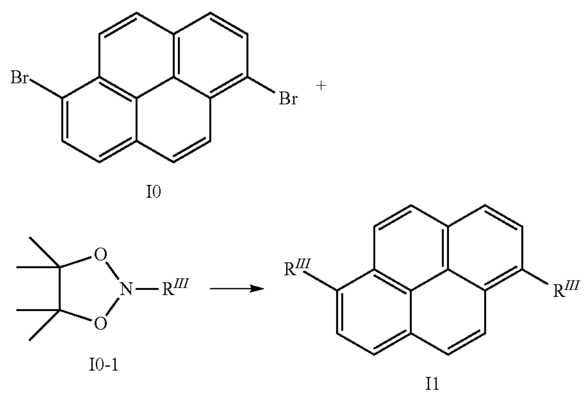

I0

I0-1

I1

I0 (1.00 equivalents), I0-1 (2.20 equivalents), tetrakis (triphenylphosphine)palladium(0) $Pd(PPh_3)_4$ (0.04 equivalents; CAS: 14221-01-3), and potassium carbonate ($K_2CO_3$; 4.00 equivalents) are stirred under nitrogen atmosphere in dioxane:water (4:1 volume ratio) at 110° C. overnight. After cooling down to room temperature (RT) the reaction mixture is extracted between DCM and brine and the phases are separated. The combined organic layers are dried over $MgSO_4$ and then the solvent is removed under reduced pressure. The crude product obtained is purified by recrystallization or column chromatography and I1 is obtained as solid. Instead of a boronic acid ester, a corresponding boronic acid may be used.

General Procedure for Synthesis AAV2

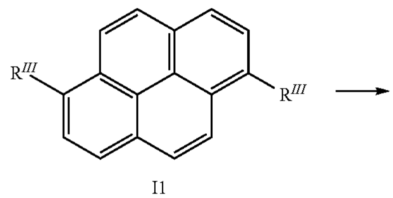

I1

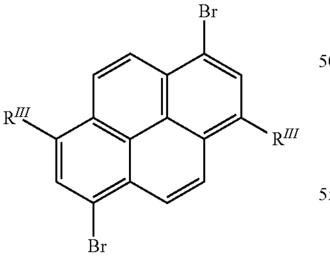

I2

I1 (1.00 equivalents) and liquid bromine (4.0 equivalents; CAS 7726-95-6) are stirred under nitrogen atmosphere in anhydrous dimethylformamide (DMF) at room temperature overnight. The reaction mixture is poured into water. The precipitates are filtered off, washed with water and ethanol. The crude product obtained is purified by recrystallization or column chromatography and I2 is obtained as solid.

General Procedure for Synthesis AAV3

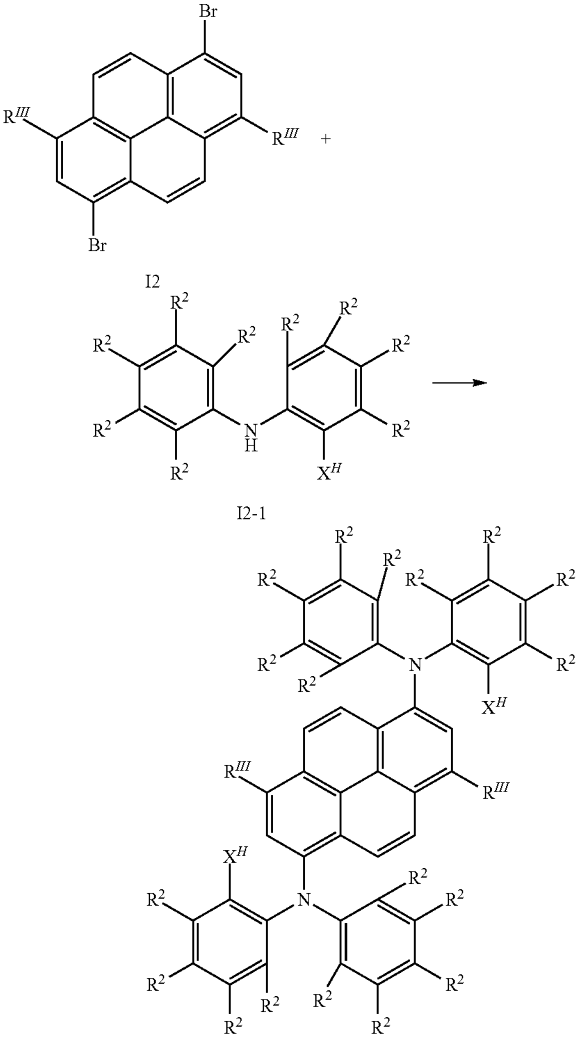

I2

I2-1

I3 wherein $X^H$ is a halogen selected from the group consisting of Cl, Br, and I. In certain embodiments, $X^H$ is Cl.

I2 (1.00 equivalents), I2-1 (2.20 equivalents), Tris(dibenzylideneacetone)dipalladium $Pd_2(dba)_3$ (0.02 equivalents; CAS 51364-51-3), and sodium tert-butoxide (4.00 equivalents, CAS 865-48-5) are stirred under nitrogen atmosphere in dry toluene. Tri-tert-butylphosphine (1 M in toluene, 0.08 equivalents, CAS 13716-12-6) is added and the mixture is stirred at 80° C. until completion. After cooling down to room temperature (RT) the reaction mixture is extracted between DCM and brine and the phases are separated. The combined organic layers are dried over $MgSO_4$ and then the solvent is removed under reduced pressure. The crude product obtained is purified by recrystallization or column chromatography and I3 is obtained as solid.

General Procedure for Synthesis AAV4

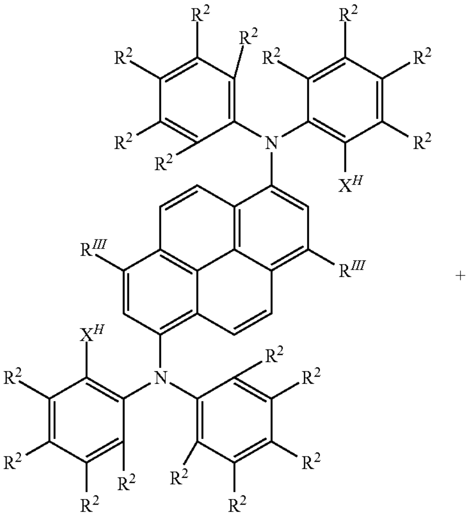

I3

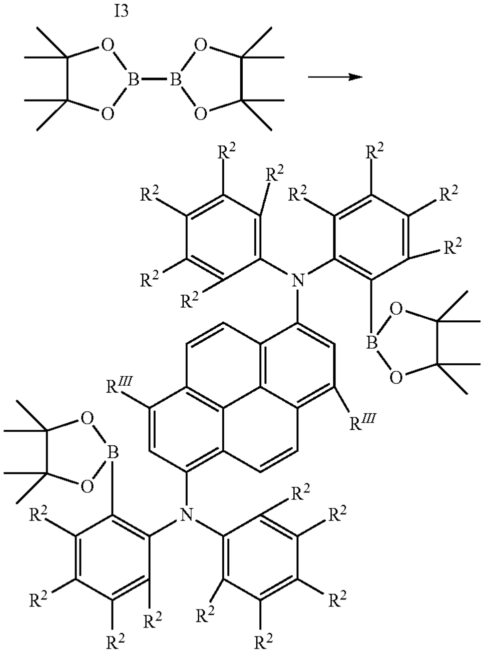

I4 wherein $X^H$ is a halogen selected from the group consisting of Cl, Br, and I. In certain embodiments, $X^H$ is Cl.

I3 (1.00 equivalents), bis(pinacolato)diboron (2.20 equivalents, CAS 73183-34-3), [1,1'-bis(diphenylphosphino)ferrocene]palladium (II) dichloride (0.05 equivalents; CAS: 72287-26-4), and potassium acetate (KOAc; 4.00 equivalents, CAS 127-08-2) are stirred under nitrogen atmosphere in dioxane at 100° C. overnight. After cooling down to room temperature (RT) the reaction mixture is extracted between DCM and brine and the phases are separated. The combined organic layers are dried over $MgSO_4$ and then the solvent is removed under reduced pressure. The crude product obtained is purified by recrystallization or column chromatography and 14 is obtained as solid.

General Procedure for Synthesis AAV4

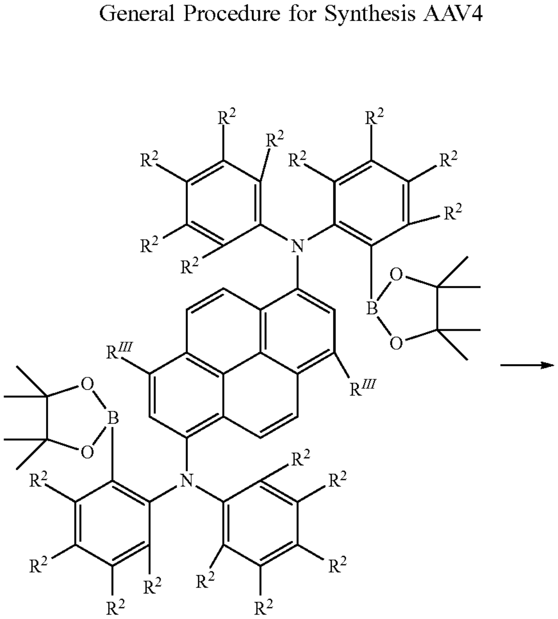

I4

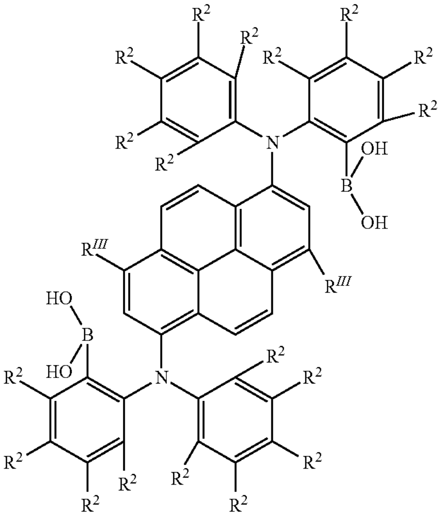

I5

I4 (1.00 equivalents) and sodium periodate (4 equivalents, CAS 7790-28-5 are dissolved under nitrogen atmosphere in THF/water (4:1 volume ratio). Hydrochloric acid (2 mol/L, 0.1 eq) is added and the mixture is stirred at room temperature for 24 h. Consequently the reaction mixture is extracted between DCM and brine and the phases are separated. The combined organic layers are dried over $MgSO_4$ and then the solvent is removed under reduced pressure. The crude product obtained is purified by recrystallization or column chromatography and 15 is obtained as solid.

General Procedure for Synthesis AAV5

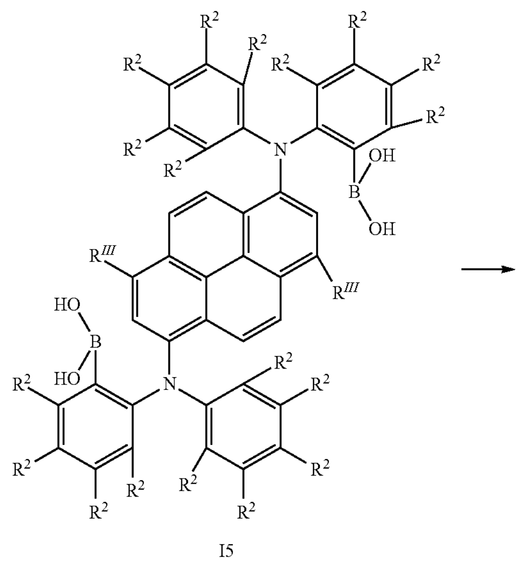

I5

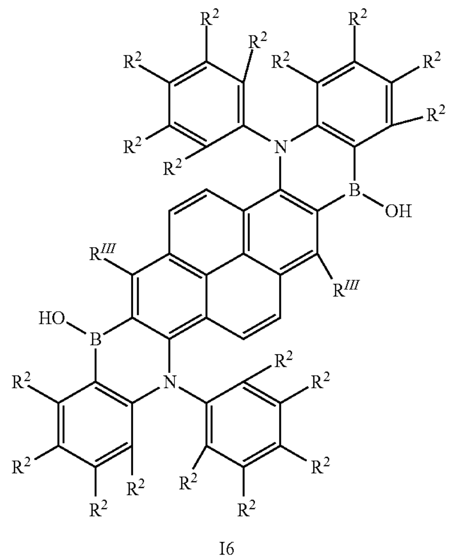

I6

I5 (1.00 equivalents) is dissolved under nitrogen atmosphere in Chlorobenzene. Boron tribromide (4.00 equivalents, CAS 10294-33-4) is added and the mixture is stirred at 100° C. for 2 h. After cooling down to room temperature (RT) water is added and the resulting solid is filtrated and washed with water and methanol. The crude product obtained is purified by recrystallization or column chromatography and I6 is obtained as solid.

General Procedure for Synthesis AAV6

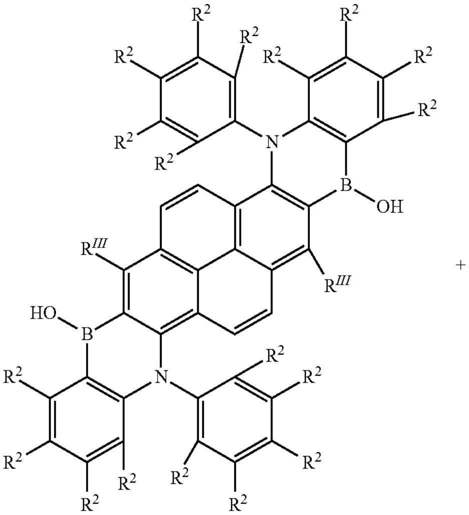

I6

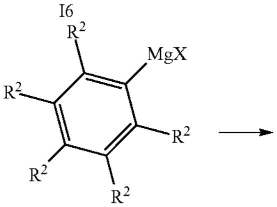

I6-1

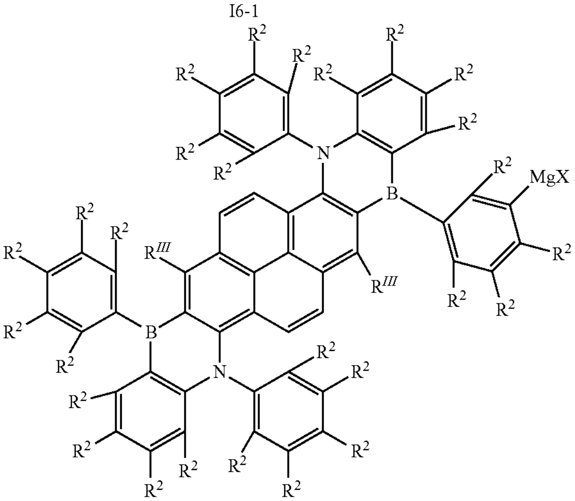

P1

I6 (1.00 equivalents) is dissolved under nitrogen atmosphere in chlorobenzene. At 0° C. boron trichloride solution (1 M in heptane, 0.67 equivalents, CAS 10294-34-5) is added and the mixture is stirred at room temperature for 2 h. A solution of an aryl Grignard reagent I6-1 (e. g. 1 M in THF, 6.00 equivalents) is added to the mixture at 0° C. The reaction mixture is stirred at room temperature for 1 h. Consequently the reaction mixture is extracted between DCM and brine and the phases are separated. The combined organic layers are dried over $MgSO_4$ and then the solvent is removed under reduced pressure. The crude product obtained is purified by recrystallization or column chromatography and P1 is obtained as solid.

Cyclic Voltammetry

Cyclic voltammograms are measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate). The measurements are conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures are optimized employing the BP86 functional and the resolution of identity approach (RI). Excitation energies are calculated using the (BP86) optimized structures employing Time-Dependent DFT (TD-DFT) methods. Orbital and excited state energies are calculated with the B3LYP functional. Def2-SVP basis sets (and an m4-grid for numerical integration are used. The Turbomole program package is used for all calculations.

Photophysical Measurements

Sample pretreatment: Spin-coating

Apparatus: Spin150, SPS euro.

The sample concentration is 0.2 mg/ml, dissolved in Toluene/DCM.

Program: 7) 30 sec. at 2000 U/min. After coating, the films are tried at 70° C. for 1 min.

Fluorescence Spectroscopy and Phosphorescence Spectroscopy

For the analysis of Phosphorescence and Photoluminescence spectroscopy, a fluorescence spectrometer "Fluoromax 4P" from Horiba is used.

Time-Resolved PL Spectroscopy in the μs-Range and ns-Range (FS5)

Time-resolved PL measurements were performed on a FS5 fluorescence spectrometer from Edinburgh Instruments. Compared to measurements on the HORIBA setup, better light gathering allows for an optimized signal to noise ratio, which favors the FS5 system especially for transient PL measurements of delayed fluorescence characteristics. The FS5 consists of a xenon lamp providing a broad spectrum. The continuous light source is a 150 W xenon arc lamp, selected wavelengths are chosen by a Czerny-Turner monochromator, which is also used to set specific emission wavelengths. The sample emission is directed towards a sensitive R928P photomultiplier tube (PMT), allowing the detection of single photons with a peak quantum efficiency of up to 25% in the spectral range between 200 nm to 870 nm. The detector is a temperature stabilized PMT, providing dark counts below 300 cps (counts per second). Finally, to determine the transient decay lifetime of the delayed fluorescence, a tail fit using three exponential functions is applied. By weighting the specific lifetimes $\tau_i$ with their corresponding amplitudes $A_i$, $$\tau_{DF} = \sum_{i=1}^{3} \frac{A_i \tau_i}{A_i}$$

the delayed fluorescence lifetime $\tau_{DF}$ is determined.

Photoluminescence Quantum Yield Measurements

For photoluminescence quantum yield (PLQY) measurements an Absolute PL Quantum Yield Measurement C9920-03G system (Hamamatsu Photonics) is used. Quantum yields and CIE coordinates are determined using the software U6039-05 version 3.6.0.

Emission maxima are given in nm, quantum yields ϕ in % and CIE coordinates as x,y values.

PLQY is determined using the following protocol:

Quality assurance: Anthracene in ethanol (known concentration) is used as reference Excitation wavelength: the absorption maximum of the organic molecule is determined and the molecule is excited using this wavelength Measurement Quantum yields are measured, for sample, of solutions or films under nitrogen atmosphere. The yield is calculated using the equation:

$$\Phi_{PL} = \frac{n_{photon}, \text{emitted}}{n_{photon}, \text{absorbed}} = \frac{\int \frac{\lambda}{hc}\left[\mathrm{Int}_{emited}^{sample}(\lambda) - \mathrm{Int}_{absorbed}^{sample}(\lambda)\right] d\lambda}{\int \frac{\lambda}{hc}\left[\mathrm{Int}_{emited}^{reference}(\lambda) - \mathrm{Int}_{absorbed}^{reference}(\lambda)\right] d\lambda}$$

wherein $n_{photon}$ denotes the photon count and Int. denotes the intensity.

Production and Characterization of Optoelectronic Devices

Optoelectronic devices, such as OLED devices, comprising organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs are characterized using standard methods and measuring electroluminescence spectra, the external quantum efficiency (in %) in dependency on the intensity, calculated using the light detected by the photodiode, and the current. The OLED device lifetime is extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, and LT 95 corresponds to the time point, at which the measured luminance decreased to 95% of the initial luminance etc.

Accelerated lifetime measurements are performed (e.g. applying increased current densities). For example, LT80 values at 500 $cd/m^2$ are determined using the following equation:

$$LT80\left(500\ \frac{\mathrm{cd}^2}{\mathrm{m}^2}\right) = LT80(L_0)\left(\frac{L_0}{\left(500\ \frac{\mathrm{cd}^2}{\mathrm{m}^2}\right)}\right)^{1.6}$$

wherein $L_0$ denotes the initial luminance at the applied current density.

The values correspond to the average of several pixels (typically two to eight), the standard deviation between these pixels is given.

HPLC-MS

HPLC-MS analysis is performed on an HPLC by Agilent (1260 series) with MS-detector (Thermo LTQ XL).

For example, a typical HPLC method is as follows: a reverse phase column 3.0 mm×100 mm, particle size 2.7 μm from Agilent (Poroshell 120EC-C18, 3.0×100 mm, 2.7 μm HPLC column) is used in the HPLC. The HPLC-MS measurements are performed at room temperature (rt) with the following gradients:

| Flow rate [ml/min] | Time [min] | A[%] | B[%] | C[%] |
|---|---|---|---|---|
| 1.5 | 30 | 40 | 40 | 30 |
| 1.5 | 45 | 10 | 10 | 80 |
| 1.5 | 50 | 40 | 10 | 80 |
| 1.5 | 51 | 30 | 40 | 30 |
| 1.5 | 55 | 30 | 10 | 30 |

using the following solvent mixtures containing 0.1% formic acid:

| | | |
|---|---|---|
| Solvent A: | H2O (10%) | MeCN (90%) |
| Solvent B: | H2O (90%) | MeCN (10%) |
| Solvent C: | THF (50%) | MeCN (50%) |

An injection volume of 2 μL from a solution with a concentration of 0.5 mg/mL of the analyte is taken for the measurements.

Ionization of the probe is performed using an atmospheric pressure chemical ionization (APCI) source either in positive (APCI+) or negative (APCI−) ionization mode or an atmospheric pressure photoionization (APPI) source.

Example 1

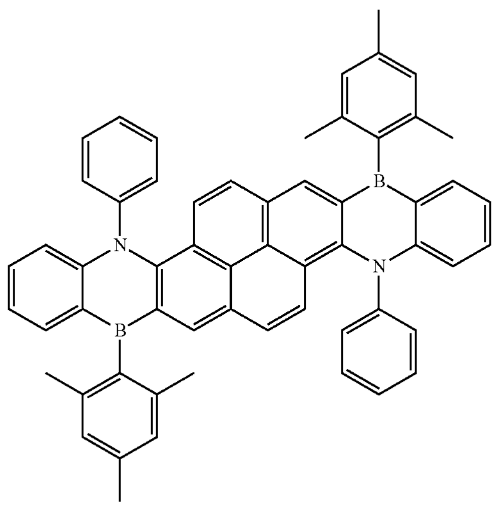 [SMILES: Cc1cc(C)c(B2c3ccccc3N(c3ccccc3)c3c2cc2ccc4c5c(cc6ccc3c2c64)B(c2c(C)cc(C)cc2C)c2ccccc2N5c2ccccc2)c(C)c1]

Example 1 was synthesized according to General synthesis scheme II and according to AAV3, AAV4, AAV5 and AAV6 wherein

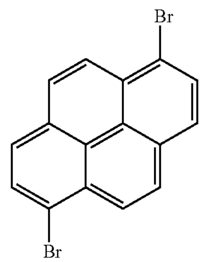 [SMILES: Brc1ccc2ccc3c(Br)ccc4ccc1c2c43]

(CAS 27973-29-1) was used as reactant I2, 2-chloro-N-phenylbenzenamine (CAS 1205-40-9) as reactant I2-1 and 2,4,6-trimethylphenylmagnesium bromide (1 M in THF, CAS 2633-66-1) as reactant I6-1.

Additional Examples of Organic Molecules of the Invention

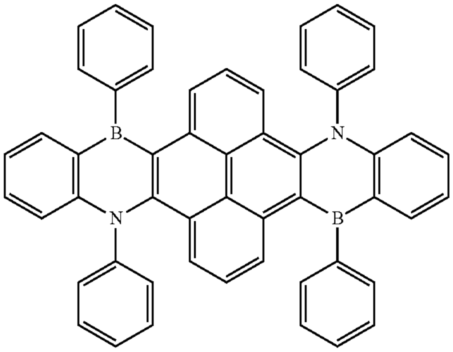

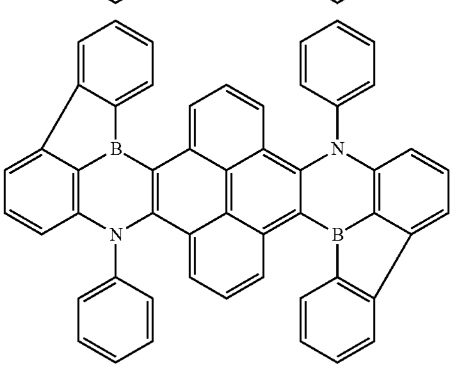

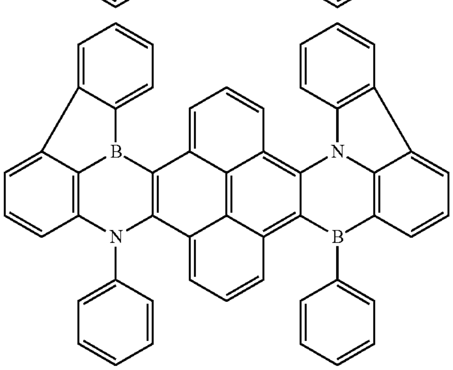

-continued
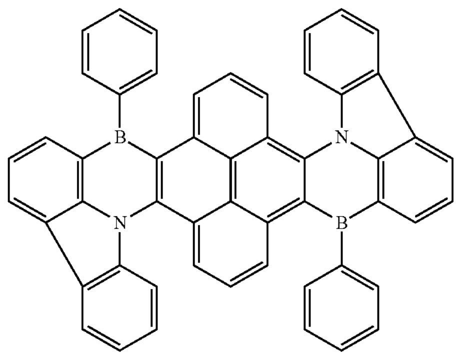
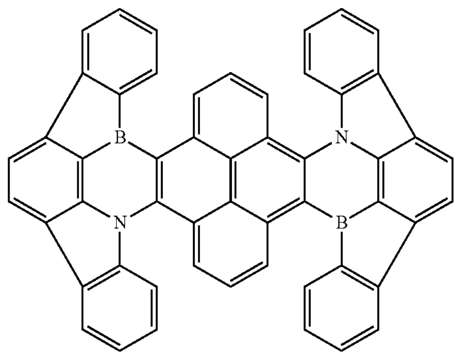
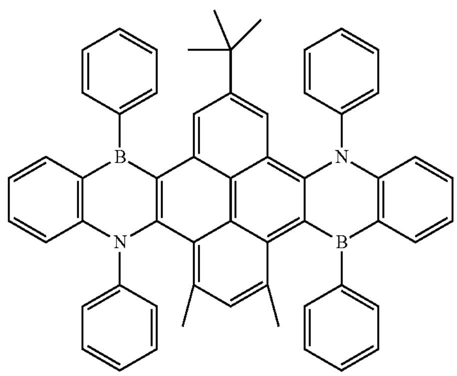
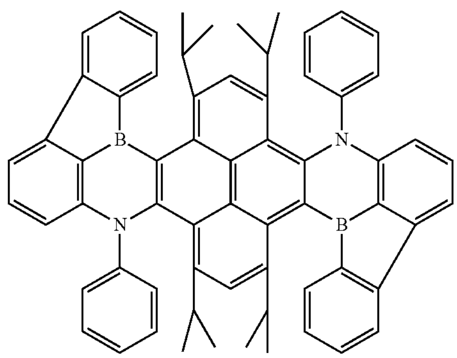
-continued
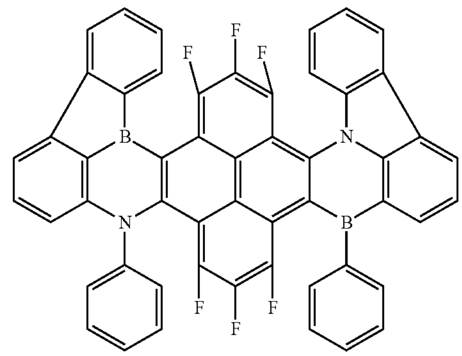
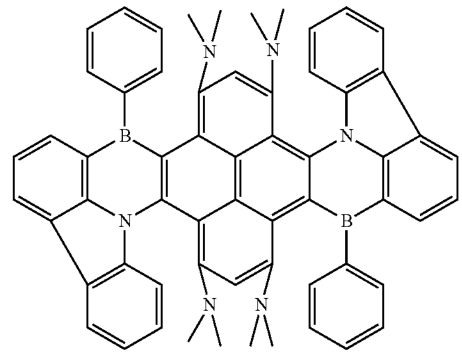
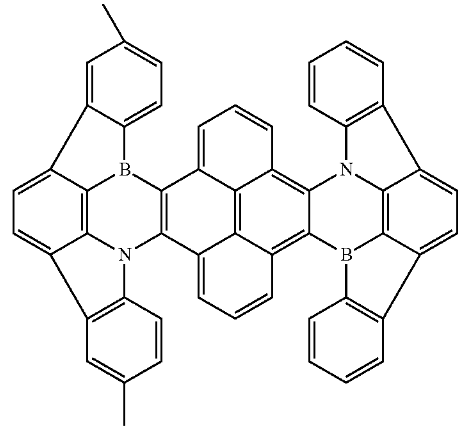
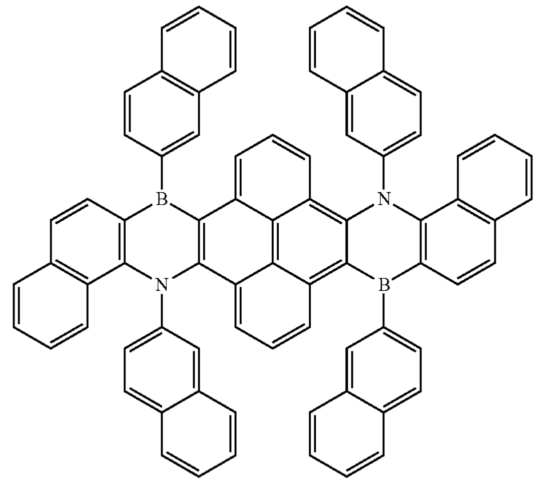

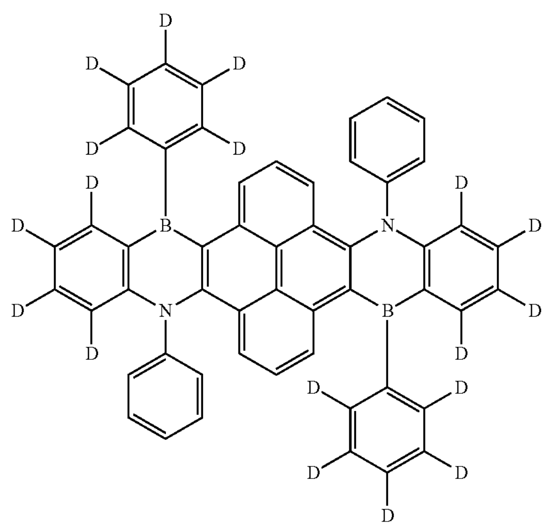
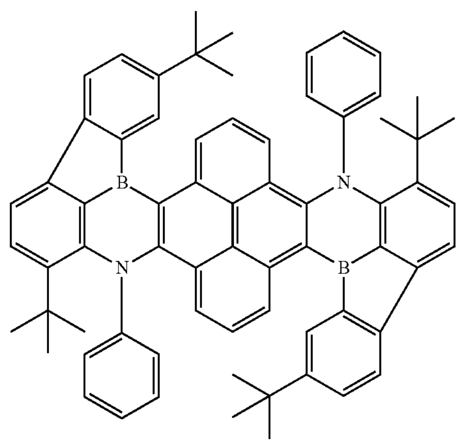
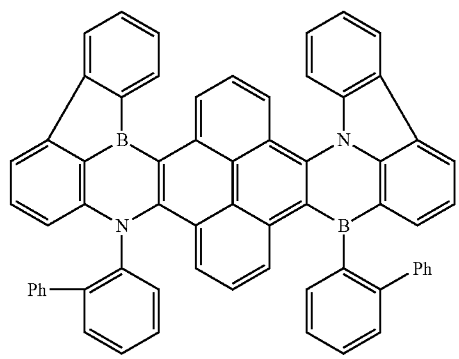
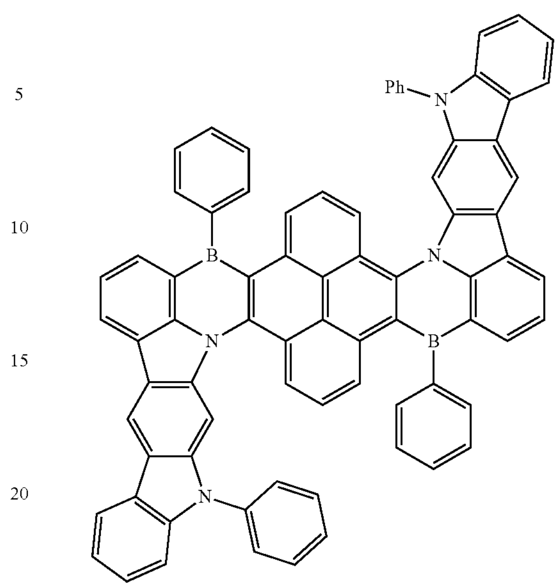
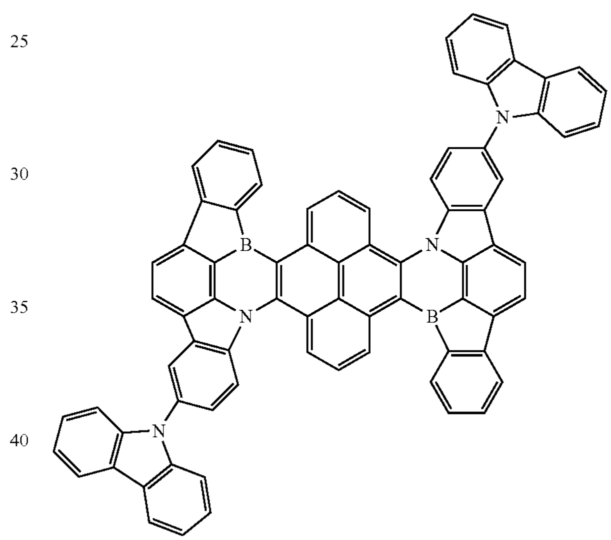
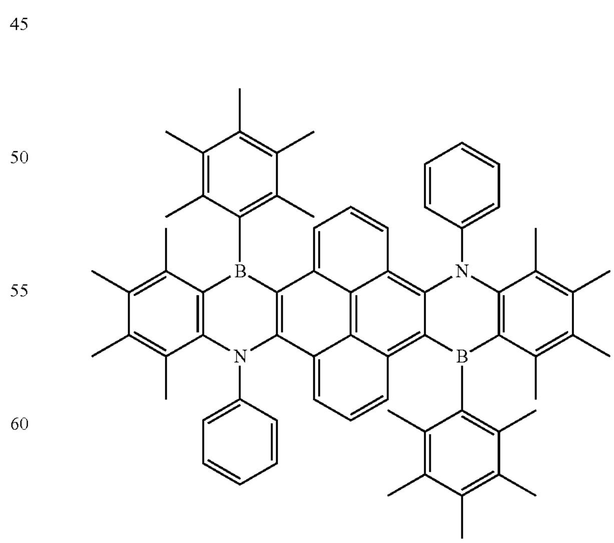

-continued
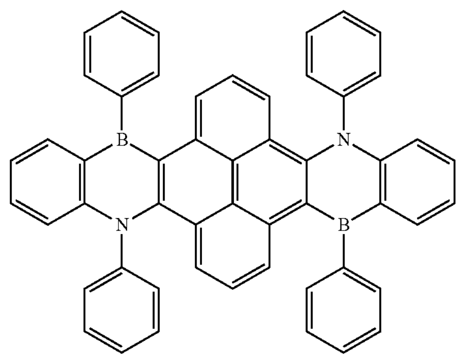
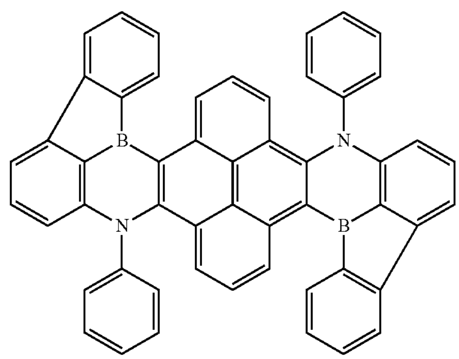
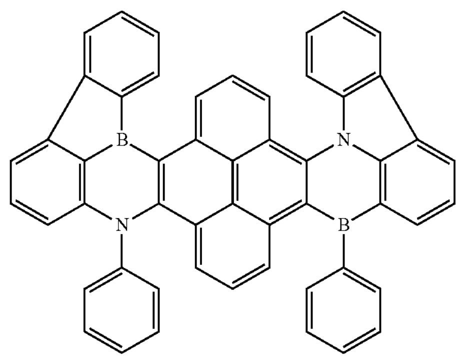
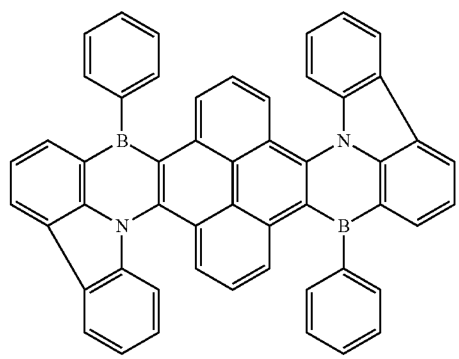
-continued
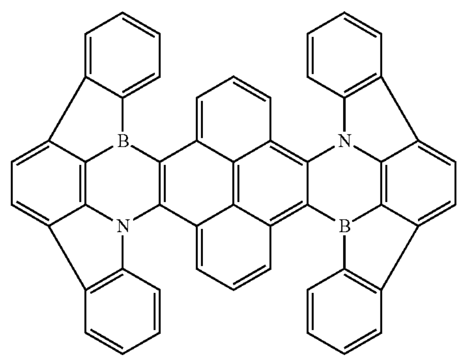
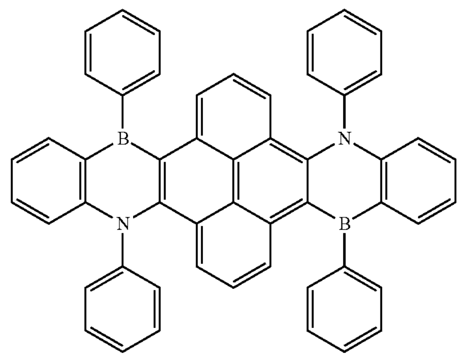
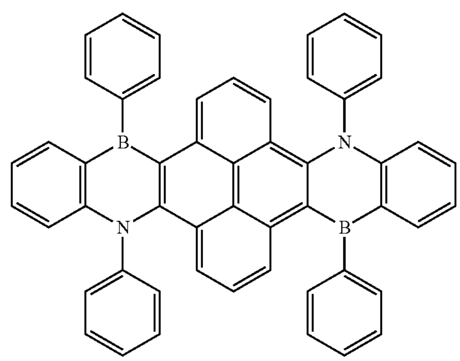
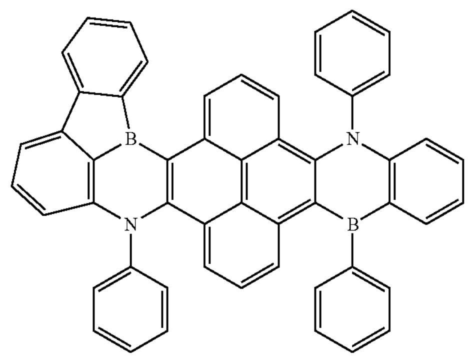

-continued
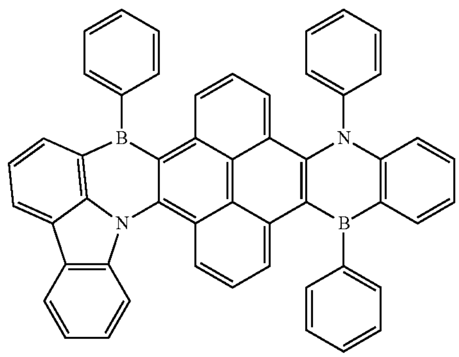
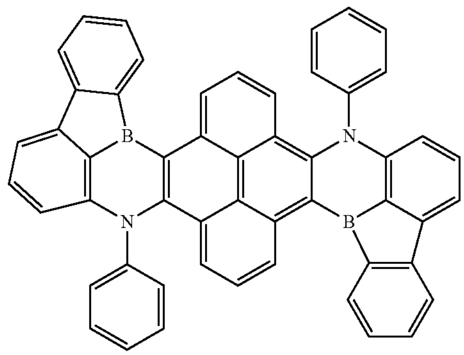
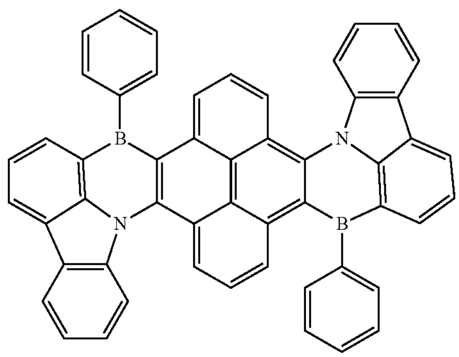
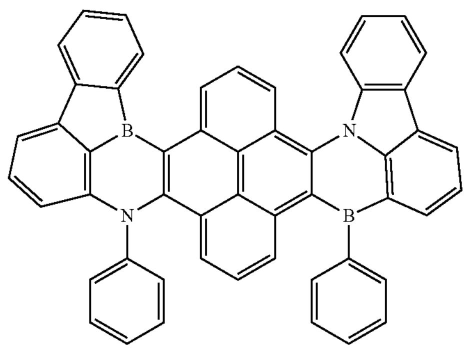
-continued
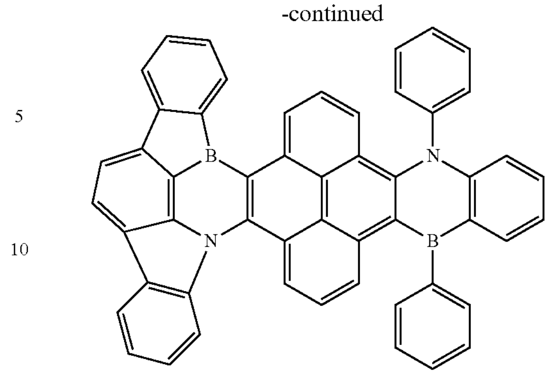
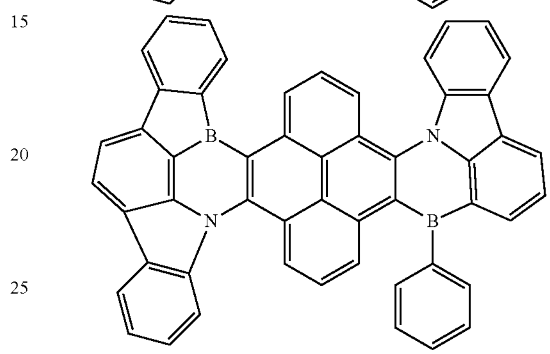
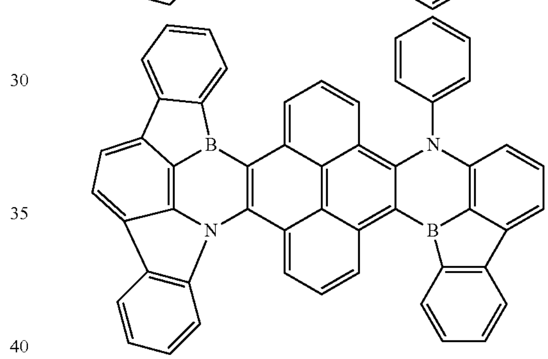
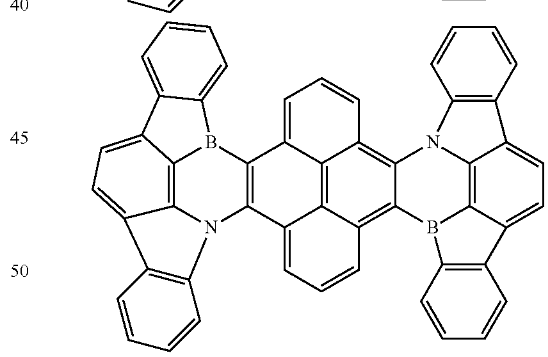
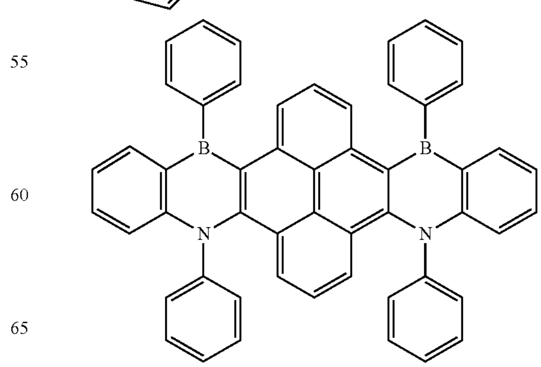

-continued
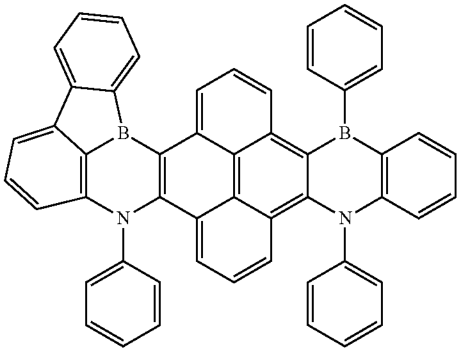
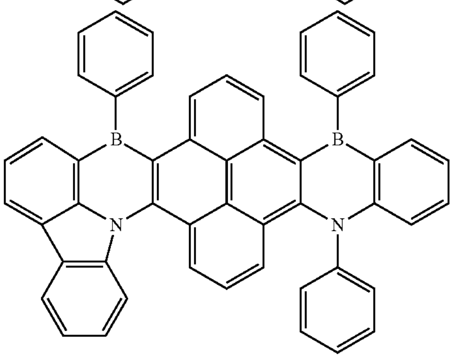
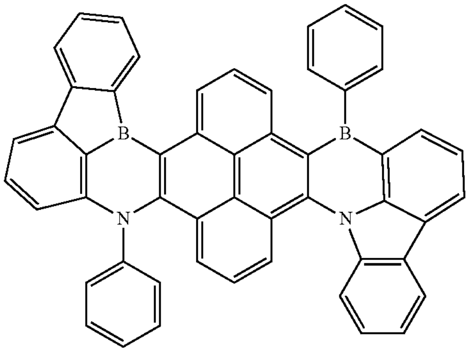
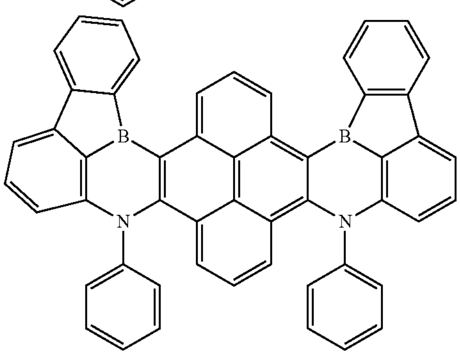
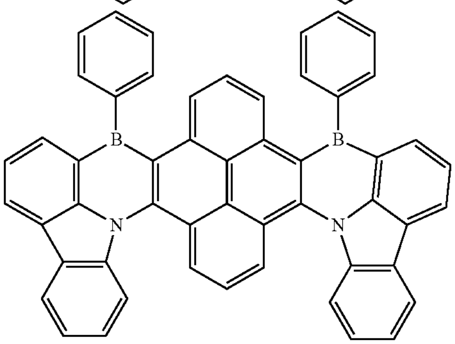
-continued
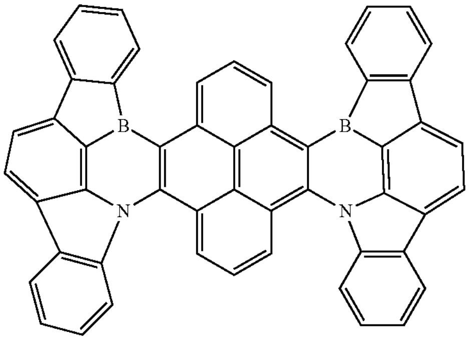
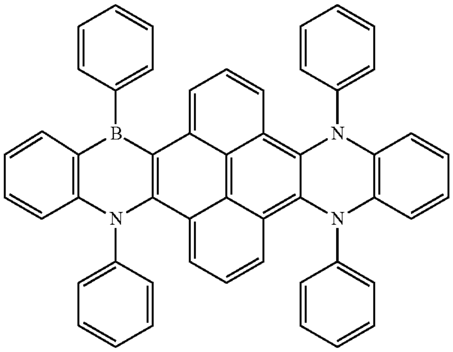
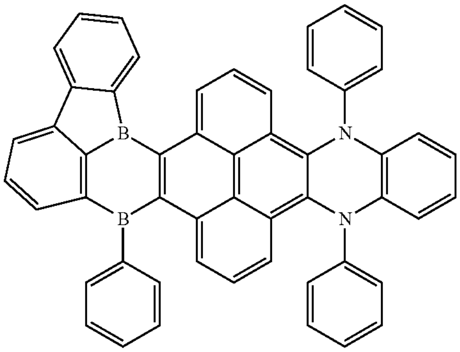
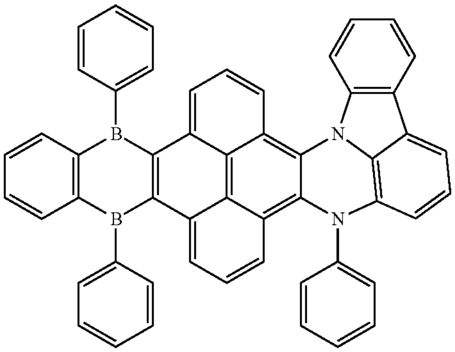

-continued
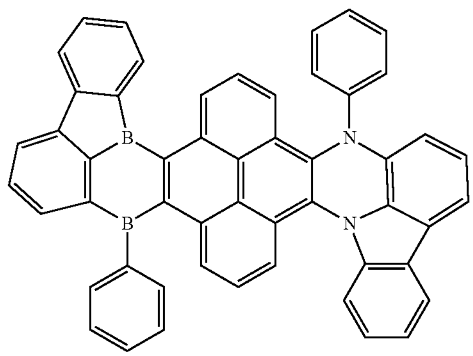
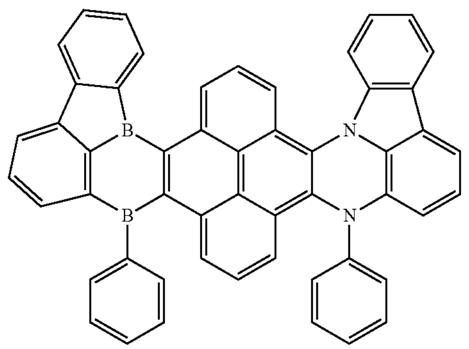
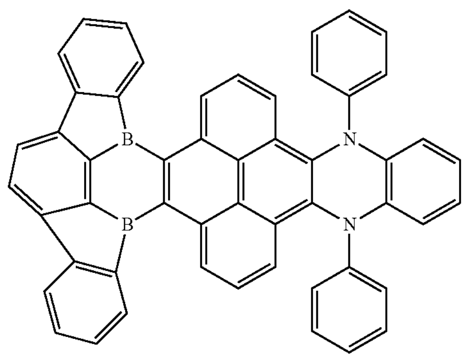
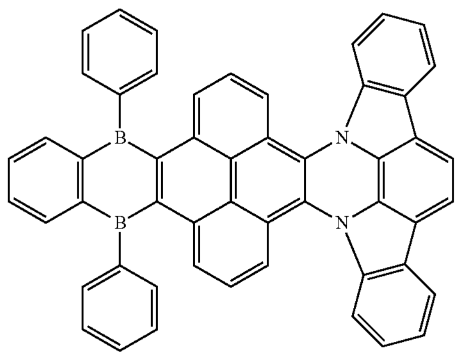
-continued
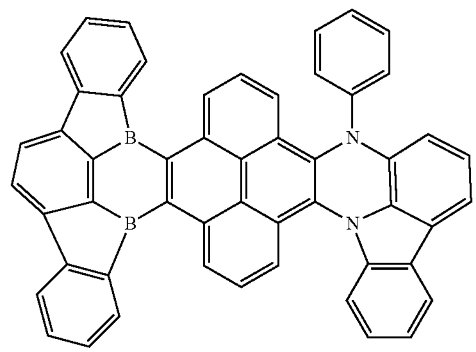
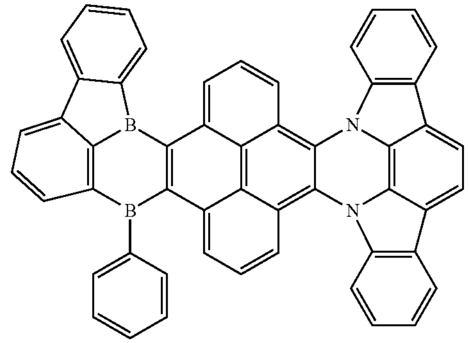
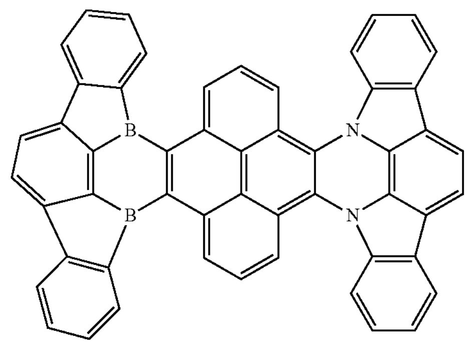
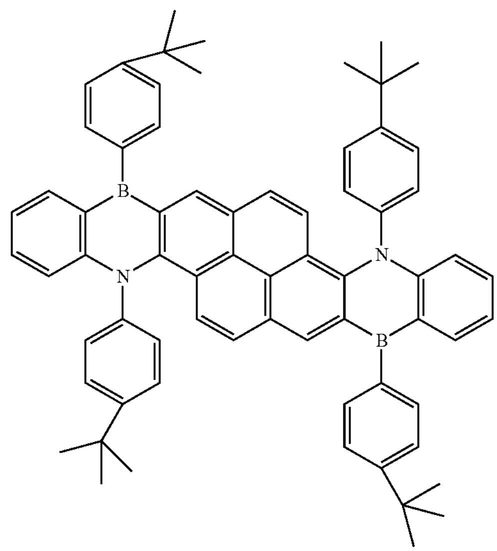

-continued
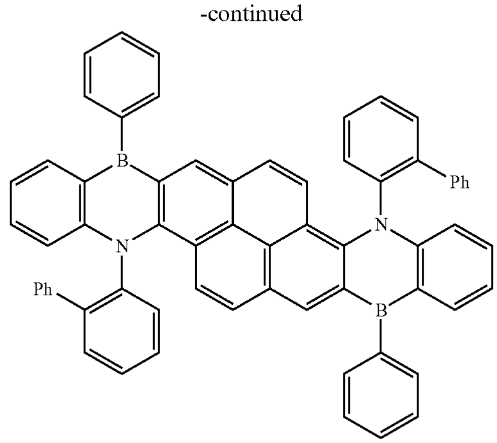
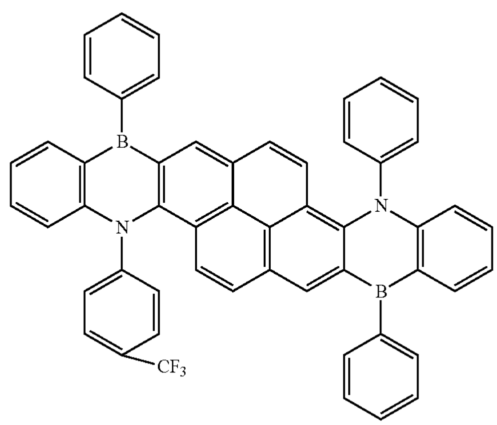
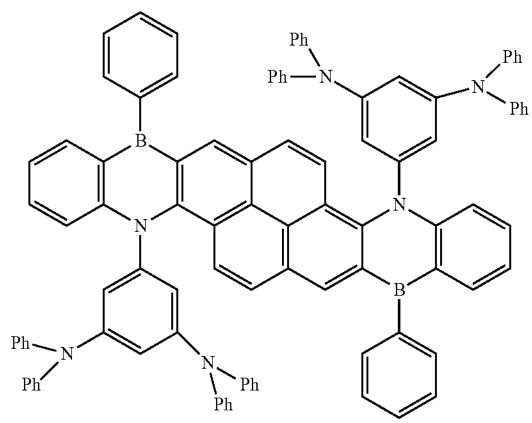
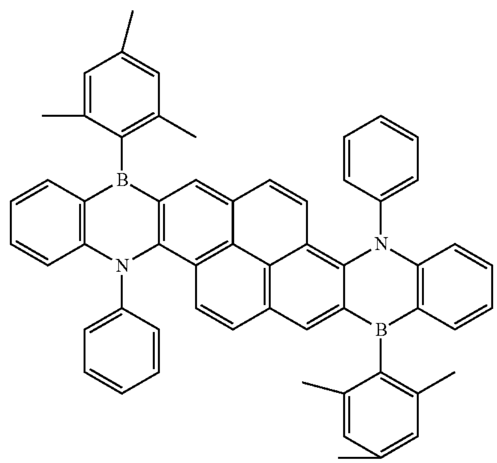
-continued
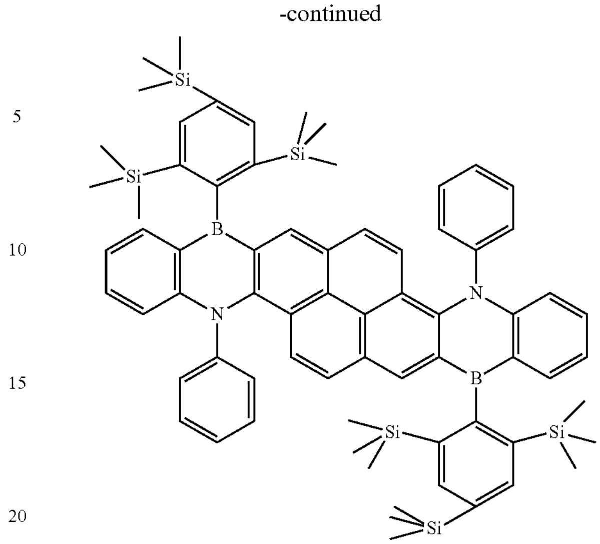
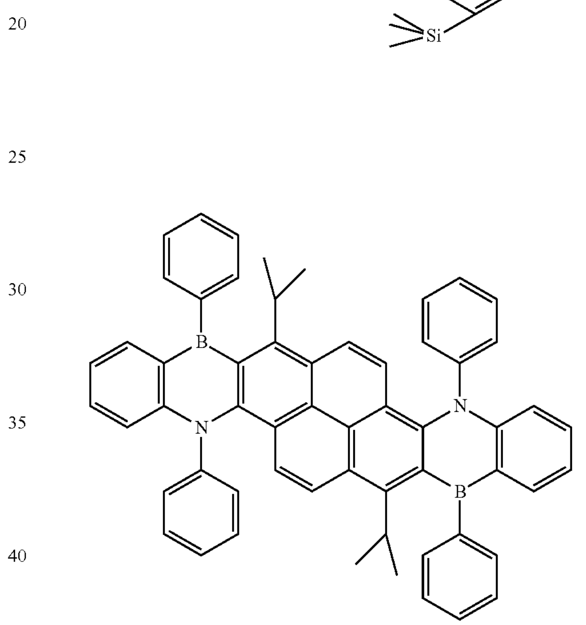
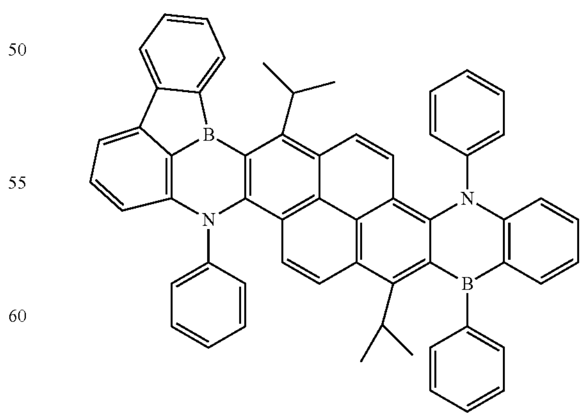

-continued
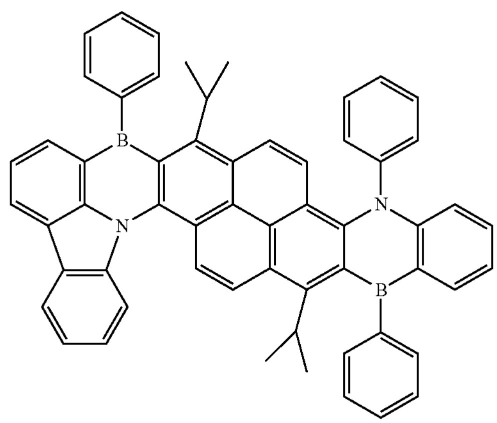
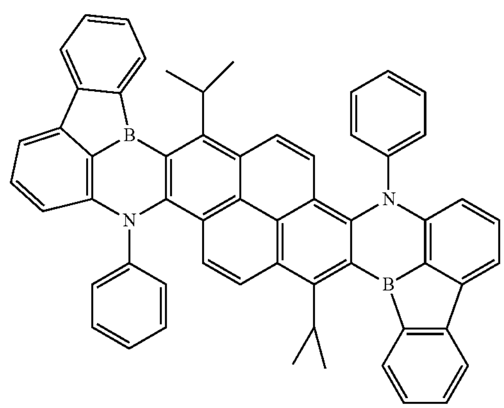
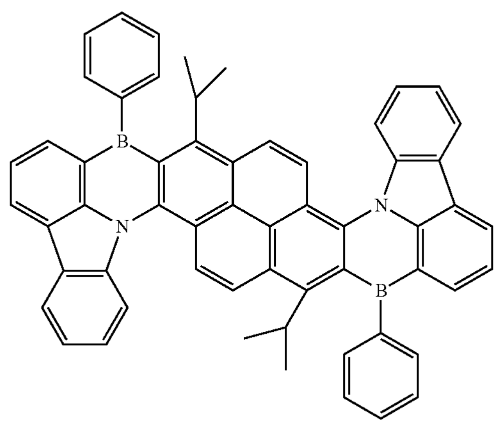
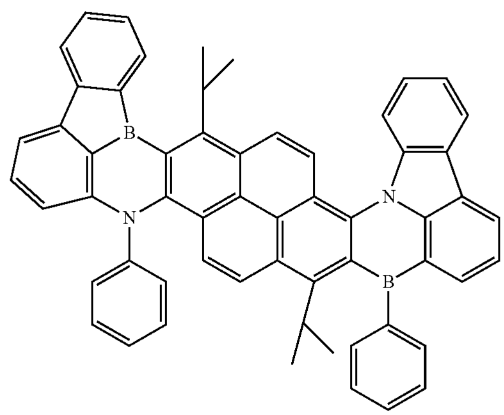
-continued
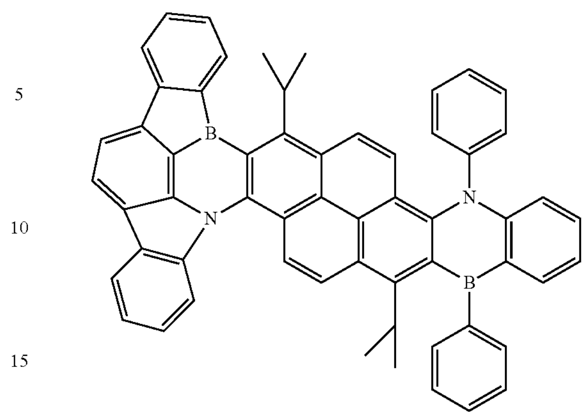
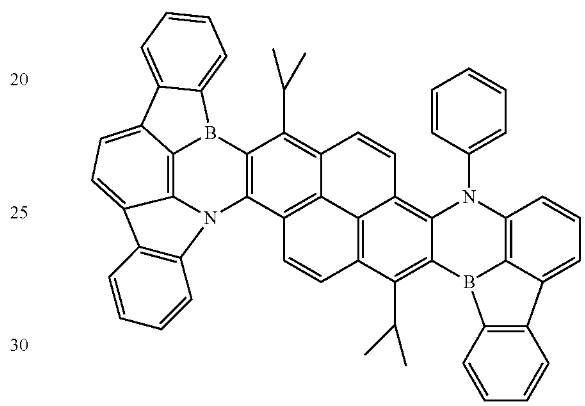
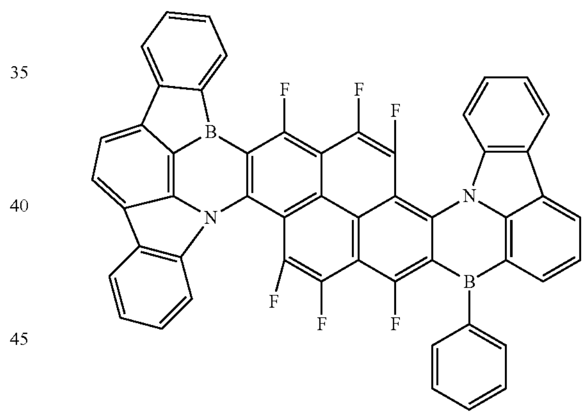
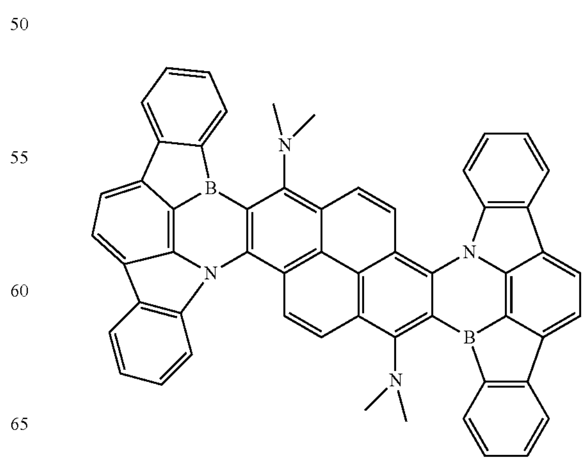

-continued
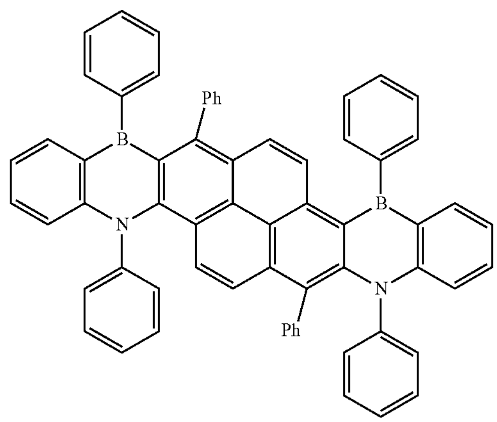
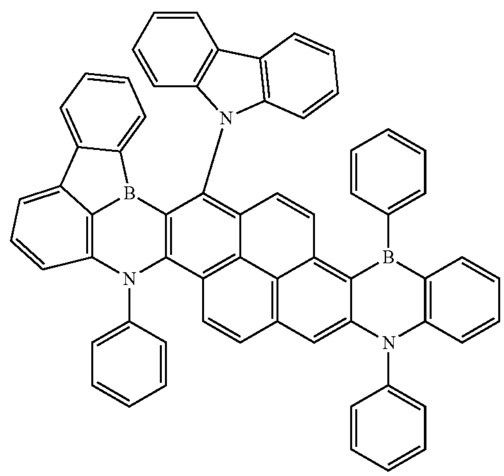
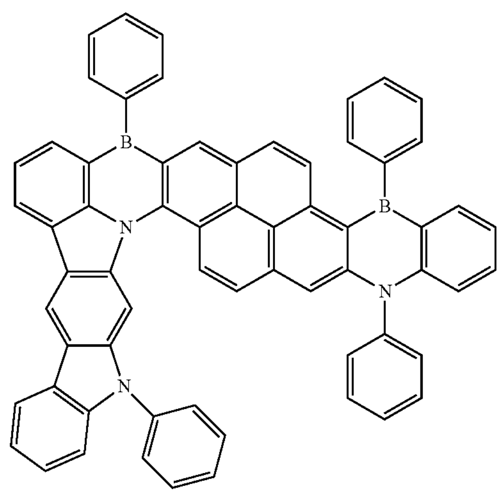
-continued
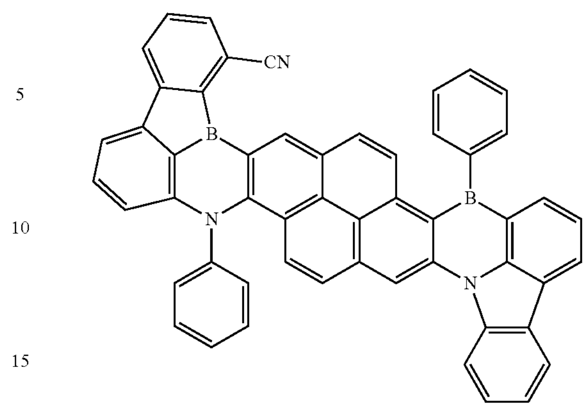
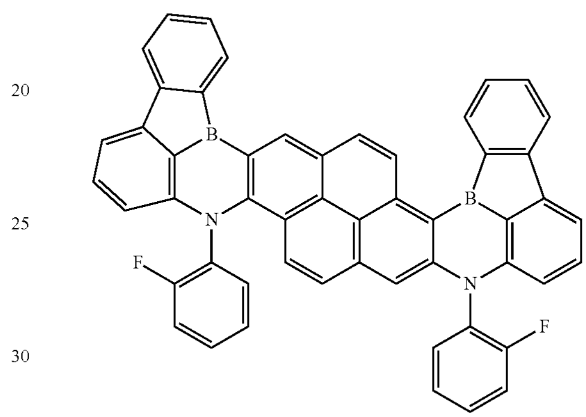
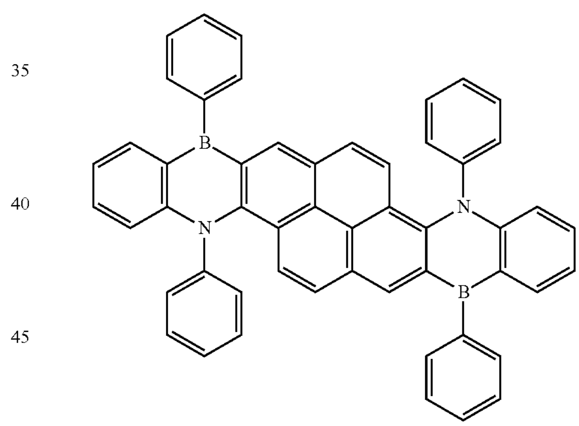
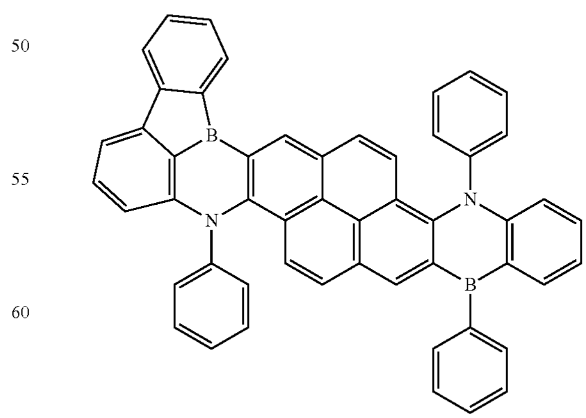

-continued
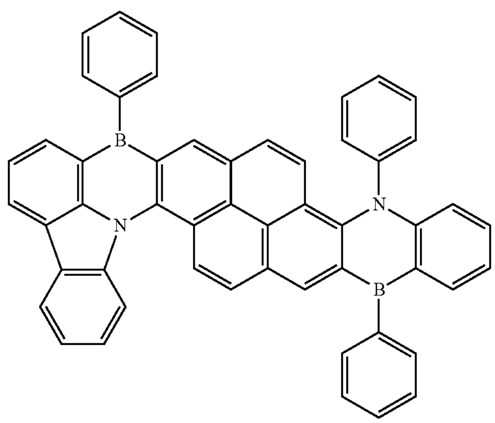
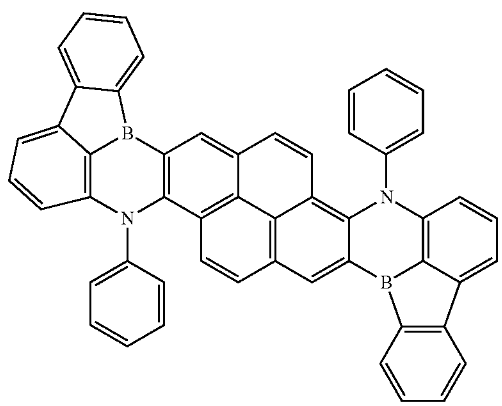
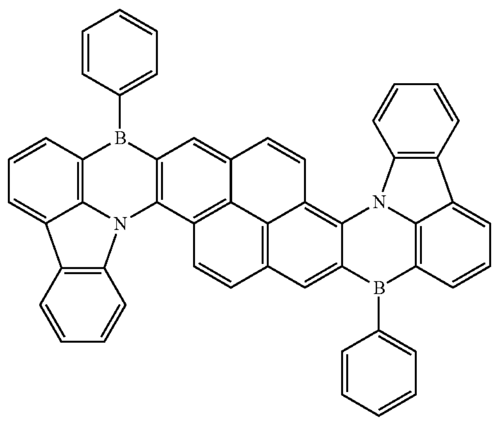
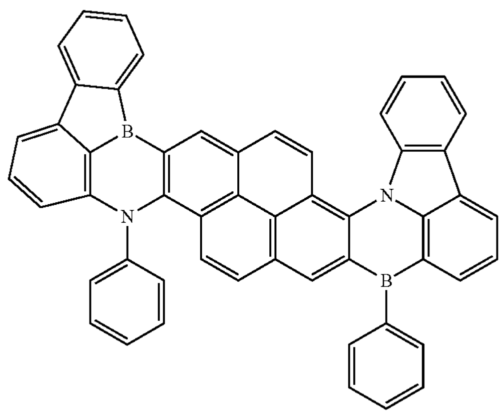
-continued
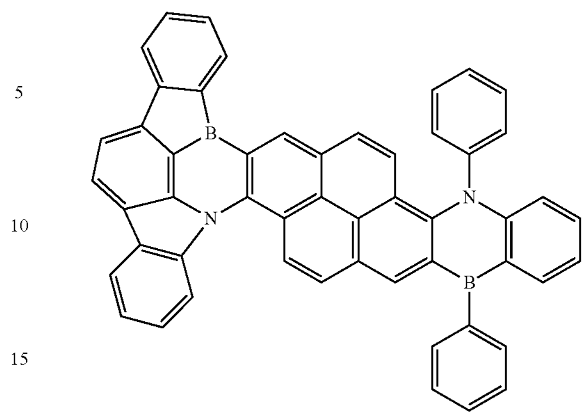
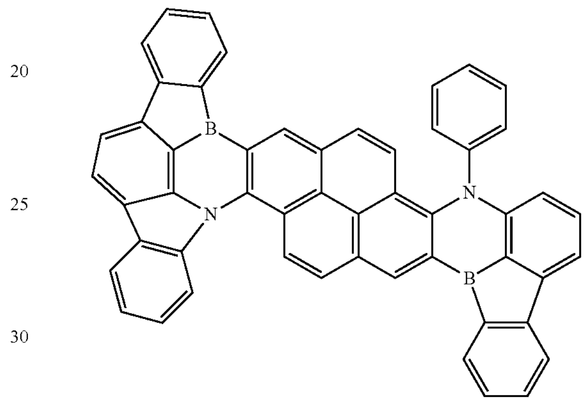
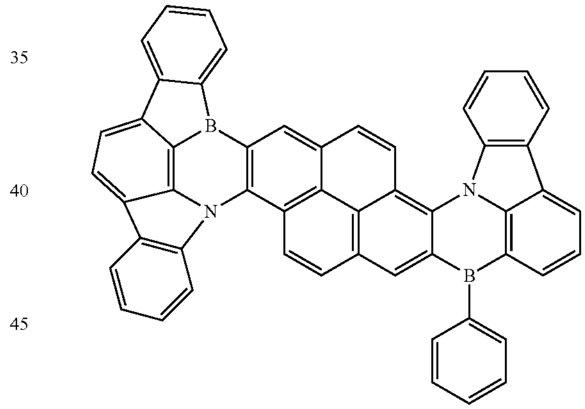
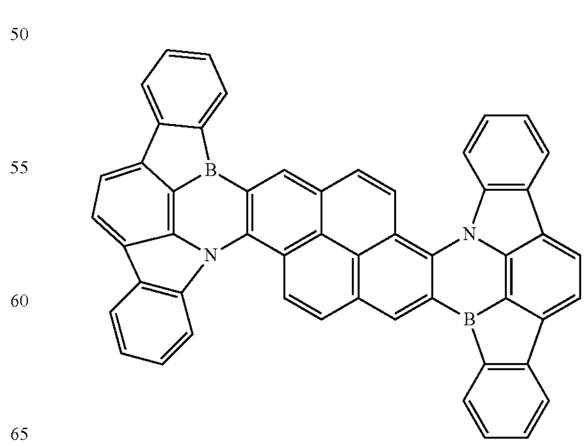

-continued
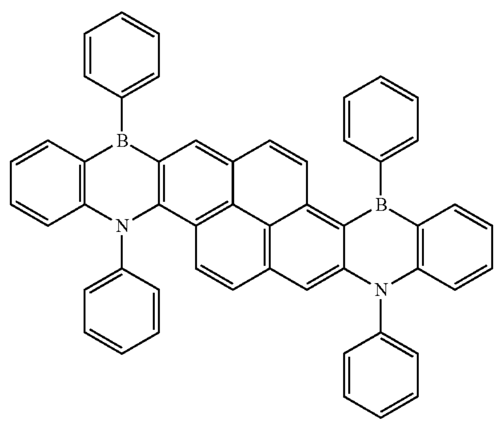
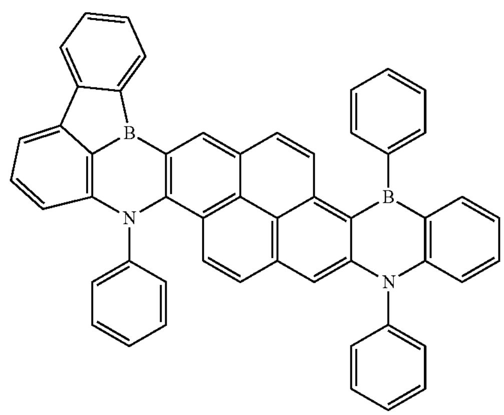
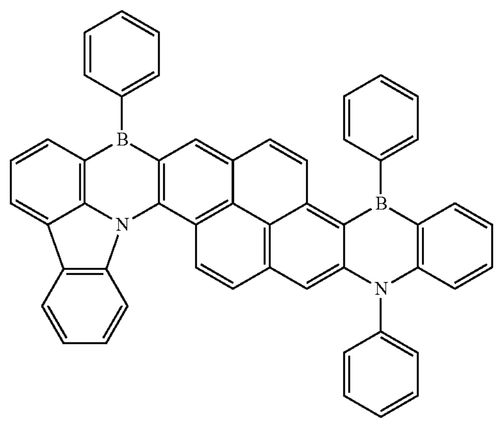
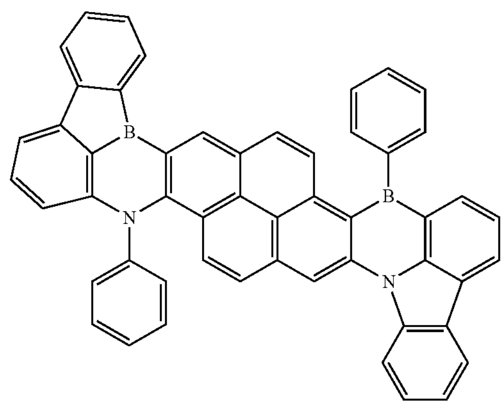
-continued
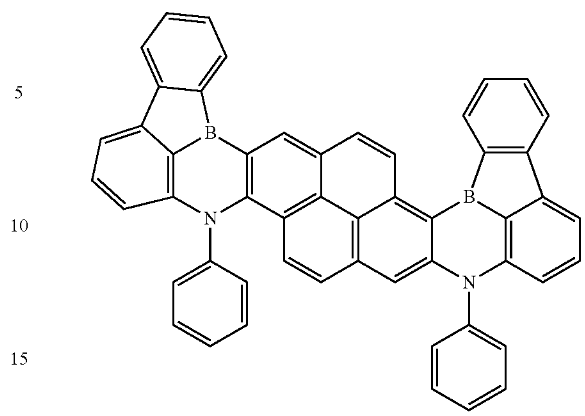
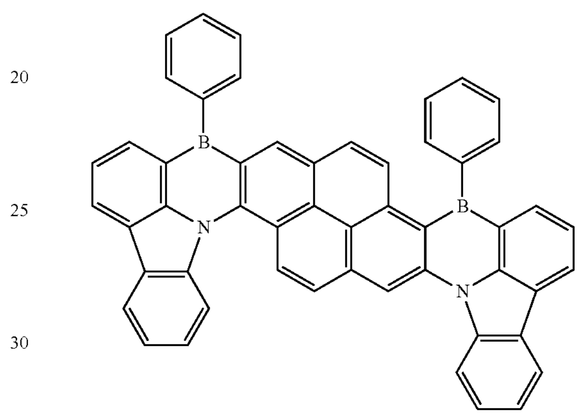
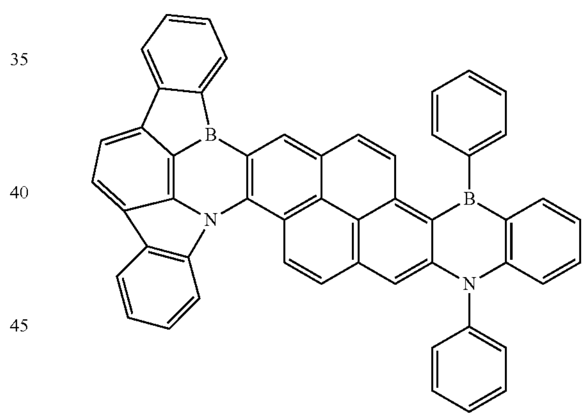
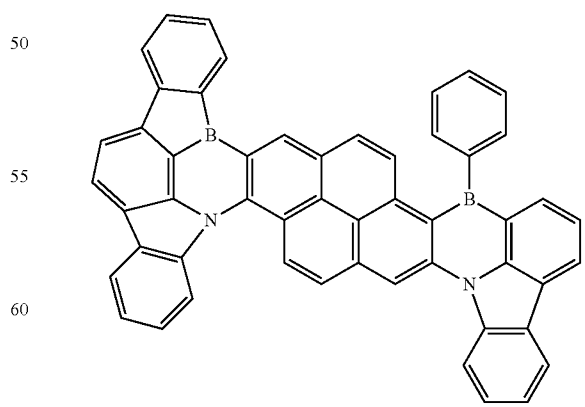

-continued
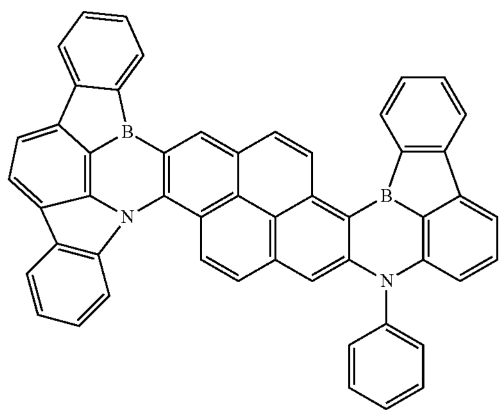
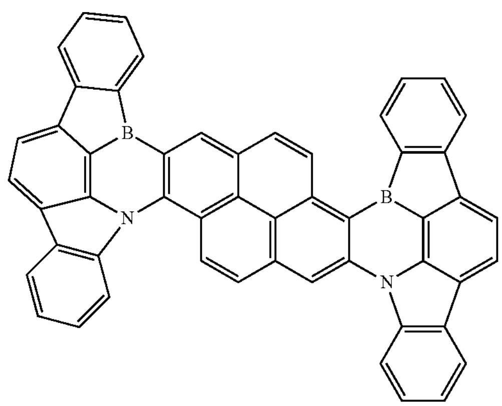
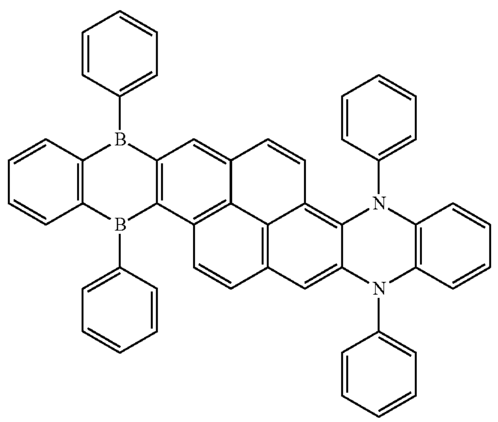
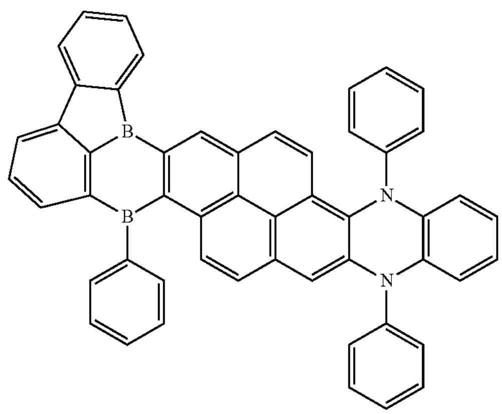
-continued
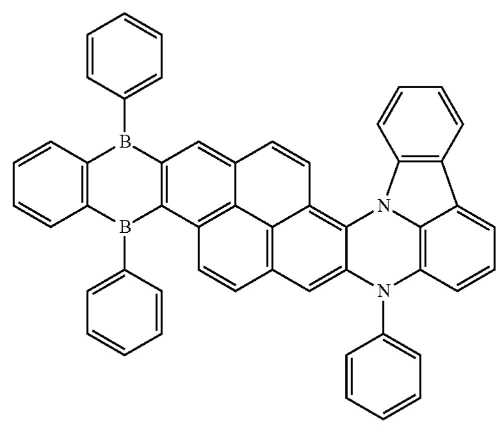
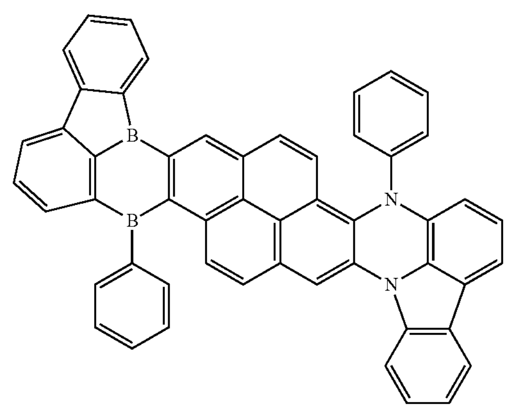
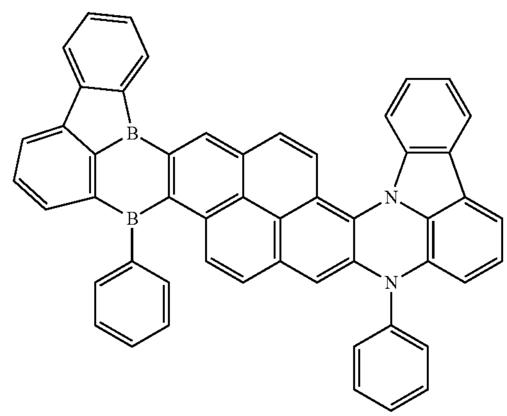
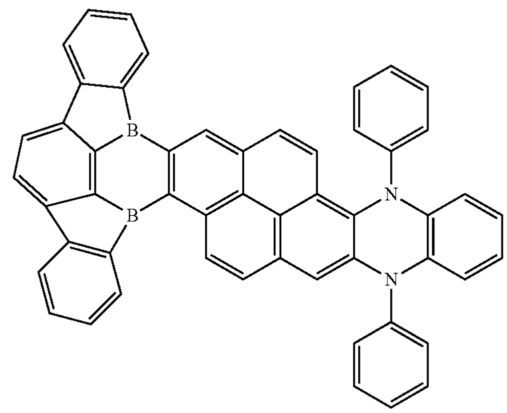

-continued

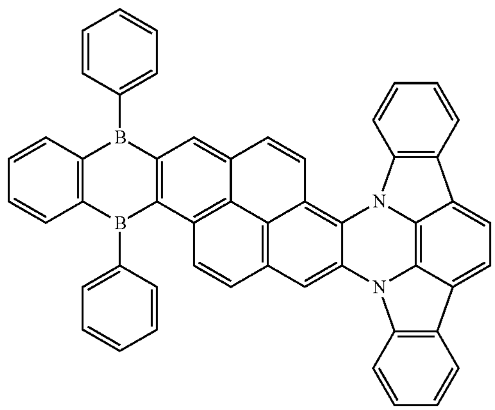

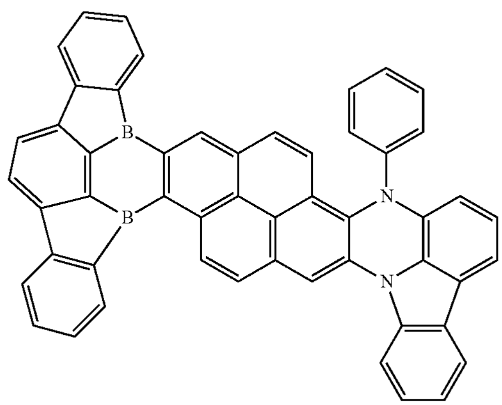

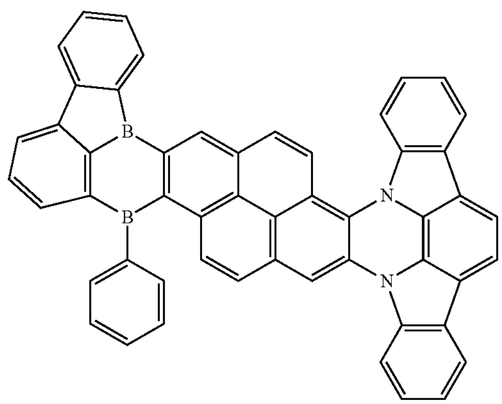

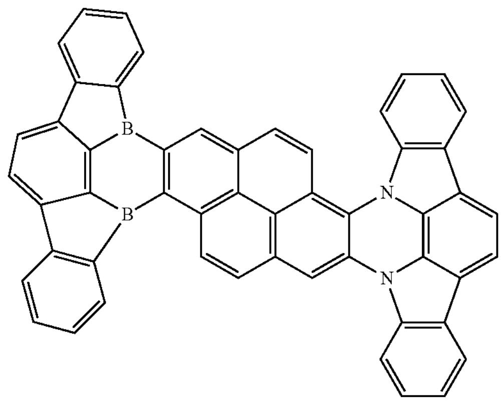

SUMMARY

The invention relates to an organic molecule for opto-electronic devices. According to the invention, the organic molecule has:

a first chemical moiety with a structure of Formula I:

Formula I

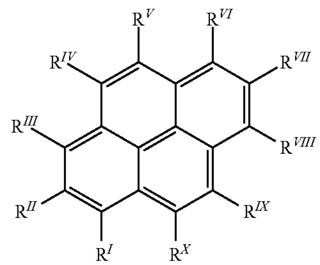

two second chemical moieties with a structure of Formula II:

Formula II

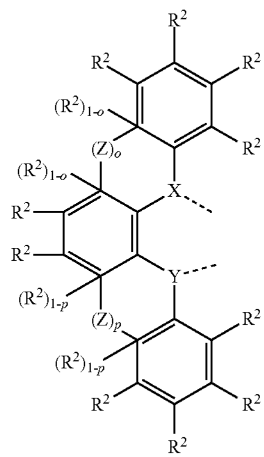

wherein

X and Y are at each occurrence independently from another selected from the group consisting of B and N;

Z is a direct bond;

$R^I$, $R^{II}$, $R^{III}$, $R^{IV}$, $R^V$, $R^{VI}$, $R^{VII}$, $R^{VIII}$, $R^{IX}$, and $R^X$ are at each occurrence independently from another selected from the group consisting of the binding site of a single bond linking the first chemical moiety to the second moiety, and R*;

R* is at each occurrence independently from another selected from the group consisting of hydrogen, deuterium, OPh, SPh, $CF_3$, CN, F, $Si(C_1\text{-}C_5\text{-alkyl})_3$, $Si(Ph)_3$, $C_1$-$C_5$-alkyl, $C_1$-$C_5$-alkoxy, $C_1$-$C_5$-thioalkoxy, $C_2$-$C_5$-alkenyl, $C_2$-$C_5$-alkynyl, $C_6$-$C_{18}$-aryl, $C_3$-$C_{17}$-heteroaryl, $N(C_6\text{-}C_{18}\text{-aryl})_2$, $N(C_3\text{-}C_{17}\text{-heteroaryl})_2$; $N(C_3\text{-}C_{17}\text{-heteroaryl})(C_6\text{-}C_{18}\text{-aryl})$; and the dashed lines represent the binding sites of the first chemical moiety to the second chemical moiety.

The invention claimed is:

1. An organic molecule, comprising:

a first chemical moiety represented by Formula I:

Formula I

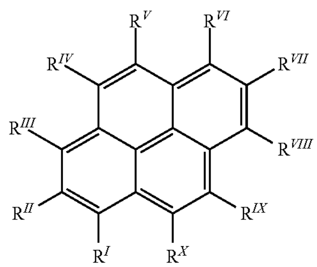

and a second chemical moiety and a third chemical moiety, each of the second chemical moiety and the third chemical moiety being independently represented by Formula II:

Formula II

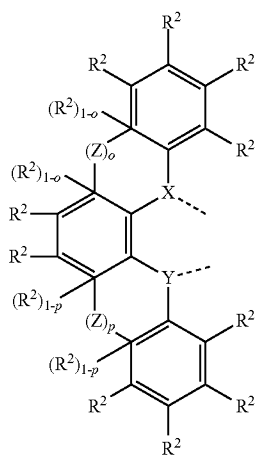

wherein

X and Y are at each occurrence independently selected from the group consisting of B and N;

$R^I$, $R^{II}$, $R^{III}$, $R^{IV}$, $R^V$, $R^{VI}$, $R^{VII}$, $R^{VIII}$, $R^{IX}$, and $R^X$ are each independently selected from the group consisting of:

a binding site of a single bond linking the first chemical moiety to the second chemical moiety, a binding site of a single bond linking the first chemical moiety to the third chemical moiety, and

R*;

R* is at each occurrence independently selected from the group consisting of:

hydrogen;

deuterium;

OPh;

SPh;

$CF_3$;

CN;

F;

$Si(C_1$-$C_5$-alkyl$)_3$;

$Si(Ph)_3$;

$C_1$-$C_5$-alkyl, wherein optionally one or more hydrogen atoms are independently substituted by deuterium (D), CN, $CF_3$, or F;

$C_1$-$C_5$-alkoxy, wherein optionally one or more hydrogen atoms are independently substituted by deuterium, CN, $CF_3$, or F;

$C_1$-$C_5$-thioalkoxy, wherein optionally one or more hydrogen atoms are independently substituted by deuterium, CN, $CF_3$, or F;

$C_2$-$C_5$-alkenyl, wherein optionally one or more hydrogen atoms are independently substituted by deuterium, CN, $CF_3$, or F;

$C_2$-$C_5$-alkynyl, wherein optionally one or more hydrogen atoms are independently substituted by deuterium, CN, $CF_3$, or F;

$C_6$-$C_{18}$-aryl, which is optionally substituted with one or more $C_1$-$C_5$-alkyl substituents, Ph, CN, $CF_3$ or F;

$C_3$-$C_{17}$-heteroaryl, which is optionally substituted with one or more $C_1$-$C_5$-alkyl substituents, Ph, CN, $CF_3$ or F;

$N(C_6$-$C_{18}$-aryl$)_2$;

$N(C_3$-$C_{17}$-heteroaryl$)_2$; and $N(C_3$-$C_{17}$-heteroaryl) ($C_6$-$C_{18}$-aryl);

wherein the dashed lines in Formula II represent the binding sites of the second chemical moiety and the third chemical moiety to the first chemical moiety;

Z is a direct bond;

o is at each occurrence independently 0 or 1;

p is at each occurrence independently 0 or 1;

$R^2$ is at each occurrence independently selected from the group consisting of:

hydrogen;

deuterium;

$N(R^5)_2$;

$OR^5$;

$Si(R^5)_3$;

$B(OR^5)_2$;

$OSOR^5$;

$CF_3$;

CN;

F;

Br;

I;

$C_1$-$C_{40}$-alkyl, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-alkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_1$-$C_{40}$-thioalkoxy, which is optionally substituted with one or more substituents $R^5$ and wherein one or more non-adjacent $CH_2$-groups are optionally substituted by $R^5C{=}CR^5$, C≡C, $Si(R^5)_2$, $Ge(R^5)_2$, $Sn(R^5)_2$, C═O, C═S, C═Se, $C{=}NR^5$, $P({=}O)(R^5)$, SO, $SO_2$, $NR^5$, O, S or $CONR^5$;

$C_2$-$C_{40}$-alkenyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_2$-$C_{40}$-alkynyl, which is optionally substituted with one or more substituents $R^5$ and wherein one or more non-adjacent $CH_2$-groups are optionally substituted by $R^5C{=}CR^5$, $C{\equiv}C$, $Si(R^5)_2$, $Ge(R^5)_2$, $Sn(R^5)_2$, $C{=}O$, $C{=}S$, $C{=}Se$, $C{=}NR^5$, $P({=}O)(R^5)$, SO, $SO_2$, $NR^5$, O, S or $CONR^5$;

$C_6$-$C_{60}$-aryl, which is optionally substituted with one or more substituents $R^5$; and $C_3$-$C_{57}$-heteroaryl, which is optionally substituted with one or more substituents $R^5$;

$R^5$ is at each occurrence independently selected from the group consisting of:

hydrogen;

deuterium;

$N(R^6)_2$;

$OR^6$;

$Si(R^6)_3$;

$B(OR^6)_2$;

$OSO_2R^6$;

$CF_3$;

CN;

F;

Br;

I;

$C_1$-$C_{40}$-alkyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{40}$-alkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_1$-$C_{40}$-thioalkoxy, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_2$-$C_{40}$-alkenyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_2$-$C_{40}$-alkynyl, which is optionally substituted with one or more substituents $R^6$ and wherein one or more non-adjacent $CH_2$-groups are optionally substituted by $R^6C{=}CR^6$, $C{\equiv}C$, $Si(R^6)_2$, $Ge(R^6)_2$, $Sn(R^6)_2$, $C{=}O$, $C{=}S$, $C{=}Se$, $C{=}NR^6$, $P({=}O)(R^6)$, SO, $SO_2$, $NR^6$, O, S or $CONR^6$;

$C_6$-$C_{60}$-aryl, which is optionally substituted with one or more substituents $R^6$; and $C_3$-$C_{57}$-heteroaryl, which is optionally substituted with one or more substituents $R^6$;

$R^6$ is at each occurrence independently selected from the group consisting of:

hydrogen; deuterium; OPh; SPh; $CF_3$; CN; F; $Si(C_1$-$C_5$-$alkyl)_3$; $Si(Ph)_3$;

$C_1$-$C_5$-alkyl, wherein optionally one or more hydrogen atoms are independently substituted by deuterium, CN, $CF_3$, or F;

$C_1$-$C_5$-alkoxy, wherein optionally one or more hydrogen atoms are independently substituted by deuterium, CN, $CF_3$, or F;

$C_1$-$C_5$-thioalkoxy, wherein optionally one or more hydrogen atoms are independently substituted by deuterium, CN, $CF_3$, or F;

$C_2$-$C_5$-alkenyl, wherein optionally one or more hydrogen atoms are independently substituted by deuterium, CN, $CF_3$, or F;

$C_2$-$C_5$-alkynyl, wherein optionally one or more hydrogen atoms are independently substituted by deuterium, CN, $CF_3$, or F;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-$aryl)_2$;

$N(C_3$-$C_{17}$-$heteroaryl)_2$; and $N(C_3$-$C_{17}$-heteroaryl) $(C_6$-$C_{18}$-aryl);

wherein adjacent groups $R^2$ are optionally bonded to each other to form an aryl or heteroaryl ring, which is optionally substituted with one or more $C_1$-$C_5$-alkyl substituents, deuterium, halogen, CN or $CF_3$; and two atoms from among X and Y in the second chemical moiety and X and Y in the third chemical moiety are B and a remaining two atoms are N; and two adjacent substituents selected from the group consisting of:

$R^I$ and $R^{II}$, $R^{II}$ and $R^{III}$, and $R^{IV}$ and $R^V$ represent the binding sites of single bonds linking the first chemical moiety to the second chemical moiety to form a ring, and two adjacent substituents selected from the group consisting of:

$R^{VI}$ and $R^{VII}$, $R^{VII}$ and $R^{VIII}$, and $R^{IX}$ and $R^X$ represent the binding sites of single bonds linking the first chemical moiety to the third chemical moiety to form a ring.

2. The organic molecule according to claim 1, wherein the organic molecule is represented by Formula Ia:

Formula Ia

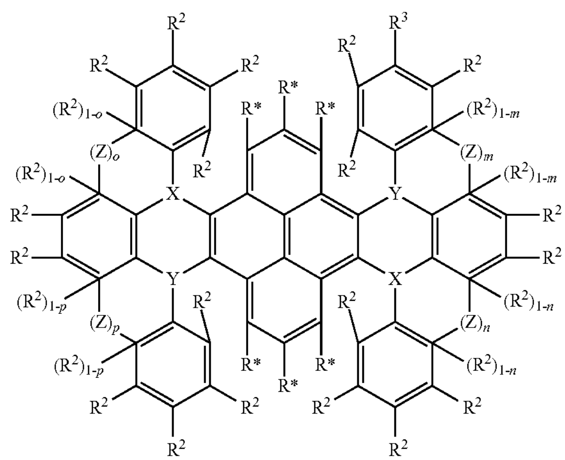

wherein in Formula Ia, m is 0 or 1;

n is 0 or 1;

and exactly two selected from the two Xs and two Ys in Formula Ia are B and a remaining two selected from the two Xs and two Ys in Formula Ia are N.

3. The organic molecule according to claim 1, wherein the organic molecule is represented by Formula Ib:

Formula Ib

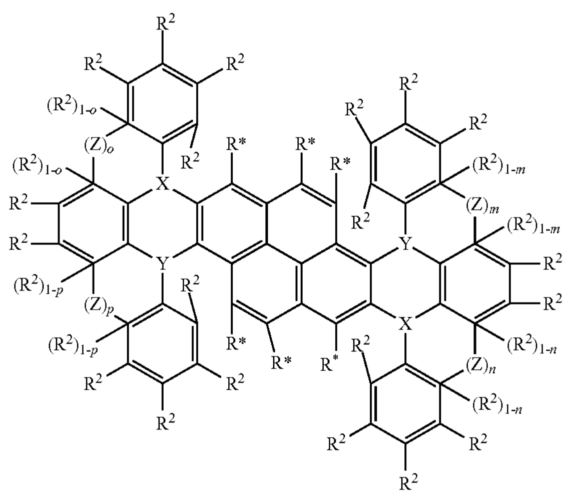

wherein in Formula Ib, m is 0 or 1, n is 0 or 1, and exactly two selected from the two Xs and two Ys in Formula Ib are B and a remaining two selected from the two Xs and two Ys in Formula Ib are N.

4. The organic molecule according to claim 1, wherein the second chemical moiety and the third chemical moiety are each independently represented by Formula IIa:

Formula IIa

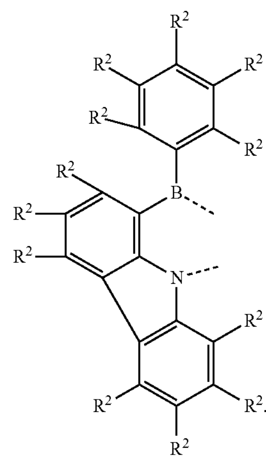

5. The organic molecule according to claim 1, wherein the second chemical moiety and the third chemical moiety are each independently represented by Formula IIb:

Formula IIb

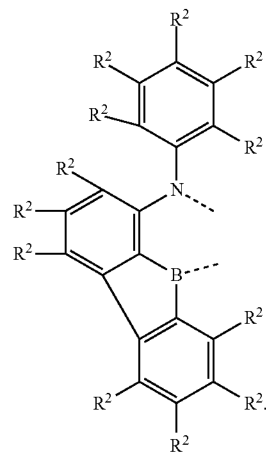

6. The organic molecule according to claim 1, wherein R* is at each occurrence independently selected from the group consisting of:

hydrogen, deuterium, Me, $^i$Pr, $^t$Bu, $SiMe_3$, $SiPh_3$, and

Ph, which is optionally substituted with one or more substituents independently selected from the group consisting of Me, $^i$Pr, $^t$Bu, and Ph.

7. The organic molecule according to claim 1, wherein $R^2$ is at each occurrence independently selected from the group consisting of:

hydrogen,

Me, $^i$Pr, $^t$Bu, CN, $CF_3$,

Ph, which is optionally substituted with one or more substituents independently selected from the group consisting of Me, $^i$Pr, $^t$Bu, CN, $CF_3$, and Ph, pyridinyl, which is optionally substituted with one or more substituents independently selected from the group consisting of Me, $^i$Pr, $^t$Bu, CN, $CF_3$, and Ph, carbazolyl, which is optionally substituted with one or more substituents independently selected from the group consisting of Me, $^i$Pr, $^t$Bu, CN, $CF_3$, and Ph, triazinyl, which is optionally substituted with one or more substituents independently selected from the group consisting of Me, $^{i}$Pr, $^{t}$Bu, CN, $CF_3$, and Ph, and $N(Ph)_2$.

8. The organic molecule according to claim 1, wherein o is 1.

9. An optoelectronic device comprising the organic molecule according to claim 1 as a luminescent emitter.

10. The optoelectronic device according to claim 9, wherein the optoelectronic device is at least one selected from the group consisting of:

organic light-emitting diodes (OLEDs),
light-emitting electrochemical cells,
OLED-sensors,
organic diodes,
organic solar cells,
organic transistors,
organic field-effect transistors,
organic lasers, and
down-conversion elements.

11. A composition, comprising:

(a) the organic molecule according to claim 1, as an emitter and/or a host, and
(b) an emitter and/or a host material, which differs from the organic molecule, and
(c) optionally, a dye and/or a solvent.

12. An optoelectronic device, comprising the composition according to claim 11, wherein the device is at least one selected from the group consisting of organic light-emitting diodes (OLEDs), light-emitting electrochemical cells, OLED-sensors, organic diodes, organic solar cells, organic transistors, organic field-effect transistors, organic lasers, and down-conversion elements.

13. The optoelectronic device according to claim 9, comprising:

a substrate,
an anode, and
a cathode, wherein the anode or the cathode is on the substrate, and
a light-emitting layer between the anode and the cathode and comprising the organic molecule.

14. A method for producing an optoelectronic device, the method comprising depositing the organic molecule according to claim 1.

15. The method according to claim 14, wherein the depositing of the organic molecule comprises a vacuum evaporation method and/or a solution method.

16. The optoelectronic device according to claim 12, comprising:

a substrate,
an anode, and
a cathode, wherein the anode or the cathode is on the substrate, and
a light-emitting layer between the anode and the cathode and comprising the composition.

17. A method for producing an optoelectronic device, the method comprising depositing the composition according to claim 11.

18. The method according to claim 17, wherein the depositing of the composition comprises a vacuum evaporation method and/or a solution method.

* * * * *